US012628480B2

(12) United States Patent
Chen et al.

(10) Patent No.: US 12,628,480 B2
(45) Date of Patent: May 12, 2026

(54) LIGHT EMITTING MODULE WITH A REDISTRIBUTION CIRCUIT FOR REDUCED PAD COUNT AND ENHANCED DISPLAY QUALITY

(71) Applicant: Innolux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 613 days.

(21) Appl. No.: 17/701,698

(22) Filed: Mar. 23, 2022

(65) Prior Publication Data

US 2022/0336721 A1 Oct. 20, 2022

(30) Foreign Application Priority Data

Apr. 20, 2021 (CN) .......................... 202110424211.8

(51) Int. Cl.
| | |
|---|---|
| *H01L 21/44* | (2025.01) |
| *H01L 25/075* | (2006.01) |
| *H10H 20/857* | (2025.01) |

(52) U.S. Cl.
CPC ....... H10H 20/857 (2025.01); H01L 25/0753 (2013.01)

(58) Field of Classification Search
CPC ............. H01L 25/0753; H01L 25/0756; H01L 25/0657; H01L 25/0655; H01L 33/62;
(Continued)

(56) References Cited

U.S. PATENT DOCUMENTS

| | | | | |
|---|---|---|---|---|
| 10,797,026 B2 * | 10/2020 | Moosburger | ........... | H05K 3/323 |
| 11,658,162 B2 * | 5/2023 | Lee | ......................... | H01L 33/62 |
| | | | | 257/72 |

(Continued)

FOREIGN PATENT DOCUMENTS

| | | | | |
|---|---|---|---|---|
| EP | 4080567 A1 * | 10/2022 | ......... | H01L 25/0753 |
| TW | 200715952 | 4/2007 | | |

(Continued)

OTHER PUBLICATIONS

"Search Report of Europe Counterpart Application", issued on Sep. 21, 2022, p. 1-p. 8.
(Continued)

*Primary Examiner* — Ajay Ojha
*Assistant Examiner* — Tsz K Chiu
(74) *Attorney, Agent, or Firm* — JCIPRNET

(57) ABSTRACT

A light emitting module and a light emitting device including the light emitting module are provided. The light emitting module includes a circuit structure and a plurality of light emitting units. The circuit structure has a first side and a second side opposite to the first side. The circuit structure includes a plurality of first pads disposed on the first side and at least one second pad disposed on the second side. The first pads are electrically connected to the at least one second pad. The light emitting units are electrically connected to the first pads. The number of the first pads is more than the number of the at least one second pad.

9 Claims, 23 Drawing Sheets

(58) Field of Classification Search

CPC ..... H01L 33/486; H01L 33/50; H01L 33/647; H01L 33/60; H01L 33/54; H01L 33/642; H01L 33/502; H01L 33/641; H01L 33/08; H01L 33/10; H01L 33/36; H01L 33/22; H01L 33/005; H01L 33/382; H01L 33/38; H01L 33/483; H01L 33/52; H01L 33/508; H01L 33/56; H01L 33/48; H01L 24/16; H01L 23/49822; H01L 23/49816; H01L 23/49827; H01L 23/49838; H01L 2225/06541; H01L 23/3128; H01L 23/5383; H01L 2224/73204; H01L 24/13; H01L 2224/0401; H01L 2225/06517; H01L 23/3114; H01L 23/5226; H01L 24/08; H01L 25/0652; H01L 2924/15311; H01L 21/4853; H01L 21/4857; H01L 22/32; H01L 2224/32225; H01L 2225/06513; H01L 24/06; H01L 24/17; H01L 24/32; H01L 24/73; H01L 2924/182; H01L 2924/3511; H01L 21/563; H01L 21/565; H01L 21/568; H01L 2224/131; H01L 2224/1403; H01L 2224/16227; H01L 2224/16237; H01L 2224/16238; H01L 2224/92125; H01L 2225/06589; H01L 23/367; H01L 23/42; H01L 23/49833; H01L 23/5384; H01L 23/5389; H01L 24/09; H01L 24/81; H01L 24/92; H01L 25/167; H01L 25/18; H01L 2224/08145; H01L 2224/16145; H01L 2225/06524; H01L 2225/06544; H01L 23/3107; H01L 23/481; H01L 23/50; H01L 23/5386; H01L 2021/60022; H01L 21/486; H01L 21/4871; H01L 21/561; H01L 22/12; H01L 22/14; H01L 2224/02375; H01L 2224/02379; H01L 2224/04105; H01L 2224/05548; H01L 2224/05553; H01L 2224/05599; H01L 2224/06155; H01L 2224/06519; H01L 2224/0801; H01L 2224/08055; H01L 2224/08056; H01L 2224/08235; H01L 2224/08245; H01L 2224/0903; H01L 2224/09132; H01L 2224/09179; H01L 2224/09519; H01L 2224/12105; H01L 2224/13022; H01L 2224/13024; H01L 2224/13083; H01L 2224/13099; H01L 2224/14519; H01L 2224/16012; H01L 2224/16055; H01L 2224/16058; H01L 2224/16059; H01L 2224/16104; H01L 2224/1703; H01L 2224/17051; H01L 2224/17055; H01L 2224/171; H01L 2224/17104; H01L 2224/17132; H01L 2224/17179; H01L 2224/17519; H01L 2224/214; H01L 2224/30519; H01L 2224/32145; H01L 2224/33519; H01L 2224/81191; H01L 2224/81203; H01L 2224/81399; H01L 2224/81447; H01L 2224/97; H01L 2225/06527; H01L 2225/06565; H01L 23/3178; H01L 23/3675; H01L 23/3677; H01L 23/3735; H01L 23/38; H01L 23/49568; H01L 23/49811; H01L 23/5223; H01L 23/5227; H01L 23/5283; H01L 23/5286; H01L 23/5381; H01L 23/5385; H01L 24/02; H01L 24/14; H01L 24/19; H01L 24/20; H01L 24/97; H01L 25/50; H01L 2924/1431; H01L 2924/157; H01L 2924/15788; H01L 2924/18162; H01L 2924/351; H01L 2924/37001; H01L 21/6835; H01L 21/76898; H01L 2221/68345; H01L 2224/0603; H01L 2224/06132; H01L 2224/06133; H01L 2224/06177; H01L 2224/06515; H01L 2224/16146; H01L 2224/16175; H01L 2224/16221; H01L 2224/16225; H01L 2224/46; H01L 2224/4801; H01L 2224/48145; H01L 2225/0651; H01L 23/291; H01L 23/3135; H01L 23/3142; H01L 23/4951; H01L 23/4952; H01L 23/49541; H01L 23/49548; H01L 23/49866; H01L 23/5387; H01L 23/642; H01L 24/04; H01L 24/05; H01L 24/46; H01L 24/48; H01L 25/042; H01L 25/105; H01L 2924/01029; H01L 2924/1436; H01L 2924/181

See application file for complete search history.

(56) References Cited

U.S. PATENT DOCUMENTS

| | | | | |
|---|---|---|---|---|
| 2010/0244059 | A1* | 9/2010 | Iida | H01L 24/19 |
| | | | | 257/E33.044 |
| 2011/0024887 | A1* | 2/2011 | Chi | H01L 24/94 |
| | | | | 257/E23.116 |
| 2016/0215943 | A1* | 7/2016 | Martin | F21S 43/14 |
| 2017/0179097 | A1* | 6/2017 | Zhang | H01L 25/167 |
| 2018/0076122 | A1* | 3/2018 | Lu | H01L 23/3157 |
| 2019/0012956 | A1 | 1/2019 | Li et al. | |
| 2019/0057955 | A1* | 2/2019 | Moosburger | H10H 20/83 |
| 2019/0096864 | A1* | 3/2019 | Huitema | H01L 25/167 |
| 2020/0373245 | A1* | 11/2020 | Chiu | H01L 23/66 |

FOREIGN PATENT DOCUMENTS

| | | | | |
|---|---|---|---|---|
| TW | M615847 | 8/2021 | | |
| WO | 2017144650 | 8/2017 | | |
| WO | WO-2017144650 A1 * | 8/2017 | .......... | G09F 9/3026 |

OTHER PUBLICATIONS

"Office Action of Taiwan Counterpart Application", issued on Oct. 18, 2022, p. 1-p. 6.

* cited by examiner

CL1

10

110

111(201)

C11

300
301 302 303

214

2121

214

2122 2123

V1
2131
V2
2132
V3
2133

W2

10

CL3

130

132

2483

2482

2481

242

W6

LIGHT EMITTING MODULE WITH A REDISTRIBUTION CIRCUIT FOR REDUCED PAD COUNT AND ENHANCED DISPLAY QUALITY

CROSS-REFERENCE TO RELATED APPLICATION

This application claims the priority benefits of China application serial no. 202110424211.8, filed on Apr. 20, 2021. The entirety of the above-mentioned patent application is hereby incorporated by reference herein and made a part of this specification.

BACKGROUND

Technical Field

The embodiments of the present disclosure relates to a light emitting module and a light emitting device including thereof.

Description of Related Art

As applications of electronic devices continue to increase, the development of display technology also improves with each passing day. Given different application conditions, the requirement standards for the display quality of electronic devices also get higher, from where different problems of electronic devices arise accordingly. Therefore, the research and development of electronic devices must be met with continuous effort.

SUMMARY

According to the embodiments of the disclosure, the light emitting module includes a circuit structure and multiple light emitting units. A circuit structure includes a first side and a second side opposite to the first side. The circuit structure includes multiple first pads disposed on the first side and at least one second pad disposed on the second side, where the first pads are electrically connected to at least one second pad. The light emitting units are electrically connected to the first pads. The number of the first pads is greater than the number of at least one second pad.

According to the embodiments of the disclosure, the light emitting device includes a driving substrate and multiple light emitting modules. Each of the light emitting modules is electrically connected to the driving substrate through at least one second pad.

Based on the above, in the light emitting module or the light emitting device including the same in the embodiments of the present disclosure, since the pads on the second side of the circuit structure may be reconfigured or integrated through the redistribution circuit layer, the number of the pads on the second side of the circuit structure may be reduced, the risk of short circuit may be reduced, or the difficulty in bonding the light emitting module with the driving substrate may be reduced. The bonding quality of the light emitting module and the driving substrate may be improved. The light emitting device may have better bonding quality or display quality.

DESCRIPTION OF THE EMBODIMENTS

Figure 1A:
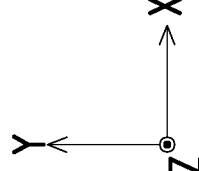
FIG. 1A is a schematic top view of a light emitting device according to an embodiment of the disclosure.

The disclosure may be understood by referring to the following detailed description and the drawings. It should be duly noted that, for the ease of readers' comprehension and the simplicity of the drawings, the drawings of this disclosure only illustrate parts of the electronic device, and the specific elements in the drawings may not be drawn to the actual scale ratio. Also, the number and size of each element in the drawings are only for schematic use, and do not limit the scope of the disclosure.

Throughout the disclosure and the appended claims, certain terms are used to refer to specific elements. Persons skilled in the art should understand that the manufacturers of electronic apparatus may not refer to the same element with same terms. The disclosure does not intend to distinguish those elements having the same function but with different names. In the following description and claims, the words "comprise," "include," and "have" are open-ended words, so they should be interpreted as "including but not limited to." Therefore, when the words like "including", "comprising," "containing," and/or "having" are used in the description of the present disclosure, they are but intend to specify the existence of corresponding features, regions, steps, operations, and/or components, and do not exclude one or more existence of corresponding features, regions, steps, operations, and/or components.

And the wordings used to indicate directions, such as "up," "down," "front," "back," "left," and "right," merely refer to directions in the drawings. As such, the directional terminology is used for purposes of illustration without the purposes of putting further limitations. In the drawings, each drawing shows the general features of the methods, structures, and/or materials used in a specific embodiment. However, these drawings should not be construed as defining or limiting the scope or nature covered by these embodiments. For example, for the sake of clarity, the relative size, thickness, and position of each film layer, region, and/or structure may be reduced or enlarged.

It should be understood that when an element or film layer is referred to as being "on" or "connected" to another element or film layer, the element or film layer may be directly on the other element or film layer, or directly connected to the other element or film layer, or there is an intervening element or film layer there between. On the contrary, when an element or a film layer is indicated to be "directly on/upon" or "directly connected to/with" another element or film layer, there is no element or film layer existing in the middle of the two. In addition, when a component is referred to as being "coupled to another component (or a variant thereof)," it may be directly connected to this other component, and/or indirectly connected (for example, electrically connected) to this other component through one or more components.

The terms "approximately," "equal to," "equate," or "same", "substantially", "about" or the like are generally interpreted as being within 20% of a given value or range, or are interpreted as being within 10%, 5%, 3%, 2%, 1%, or 0.5% a given value or range.

When a structure (or a layer, a component, and a substrate) is described in this disclosure to be located on another structure (or a layer, a component, and a substrate), it can mean that the two structures are adjacent to each other and are directly connected, or it can mean that two structures are adjacent to each other but are indirectly connected. Indirect connection between adjacent structures indicates: there is at least one intermediate structure (or an intermediate layer, component, substrate, and space) between the two structures, where the lower surface of one of the structures is adjacent to or directly connected to the upper surface of the intermediate structure, while the upper surface of another one of the structures is adjacent to or directly connected to the lower surface of the intermediate structure, and the intermediate structure may be a single-layer or multi-layer solid structure or a non-physical structure, to which the disclosure does not limit. In this disclosure, when a certain structure is "on" another structure, it may mean that a certain structure is "directly" on other structures, or that a certain structure is "indirectly" on other structures, that is, there is at least one structure clamped between the certain structure and other structures.

The terms such as "first" and "second" in the specification or the claims are only used to describe all kinds of elements, components, regions, layers, and/or parts, but are not intended to limit the elements, components, regions, layers, and/or parts. These terms are only used to distinguish one element, component, region, layer, and/or part from another. Therefore, the first element, component, region, layer, or part discussed below is used to set itself apart from the second element, component, region, layer, or part and are not used to limit their order or specific elements, components, regions, layers and/or parts.

According to the embodiments of the present disclosure, the optical microscopy (OM), scanning electron microscope (SEM), film thickness profile measuring instrument (α-step), ellipsometer, or other suitable methods may be used to measure the width, thickness, height, or area of each element, or the distance or spacing between elements, but the disclosure is not limited thereto. Specifically, in some embodiments, the cross-sectional structural image of the component to be measured as well as the width, thickness, height, or area of each component, or the distance or spacing between the components may be obtained by the scanning electron microscope, and the component volume may be obtained through any appropriate methods (for example, integration). In addition, certain margin is allowed in any two values or directions used for comparison.

Electronic devices, such as the light emitting module or the light emitting device of the disclosed embodiments, have better bonding quality. Such electronic devices include a display device, an antenna device, a sensing device, a splicing device, or a transparent display device, but the disclosure is not limited thereto. The electronic device may be a rollable, stretchable, bendable, or flexible electronic device. The electronic devices may include, for example, liquid crystal, light emitting diode (LED), quantum dot (QD), fluorescence, phosphor, or other suitable materials, and such material may be any permutation and combination or other suitable display medium, or a combination thereof; the light emitting diode may include, for example, organic light emitting diode (OLED), millimeter/sub-millimeter light emitting diode (mini LED), micro-light emitting diode (micro LED), or quantum dot light emitting diode (for example, QLED), but the disclosure is not limited thereto. The antenna device includes, for example, a liquid crystal antenna, but is not limited thereto. The splicing device may be, for example, a display splicing device or an antenna splicing device, but the disclosure is not limited thereto. Note that the electronic device may be any combination of the foregoing, but the disclosure is not limited thereto. In addition, the appearance of the electronic device may be rectangular, circular, polygonal, a shape with curved edges, or any other suitable shapes. The electronic device may have peripheral systems, such as a driving system, a control system, a light source system, a shelf system, etc., to support the display device, the antenna device, or the splicing device. The light emitting module or the light emitting device is adapted as the electronic device hereinafter to illustrate the content of the disclosure, but the disclosure is not limited thereto.

In the disclosure, different embodiments described below may be in combination with one another as long as they do not violate or in conflict with the spirit of the disclosure. For example, part of the features of an embodiment may be combined with that of another embodiment at will with the premise that they do not violate or in conflict with the spirit of the disclosure.

Reference is now to be made in detail to the exemplary embodiments of the present disclosure, and examples of the exemplary embodiments are illustrated in the drawings. Whenever possible, the same reference symbols are used in the drawings and the description to indicate the same or similar parts.

Figure 1B:
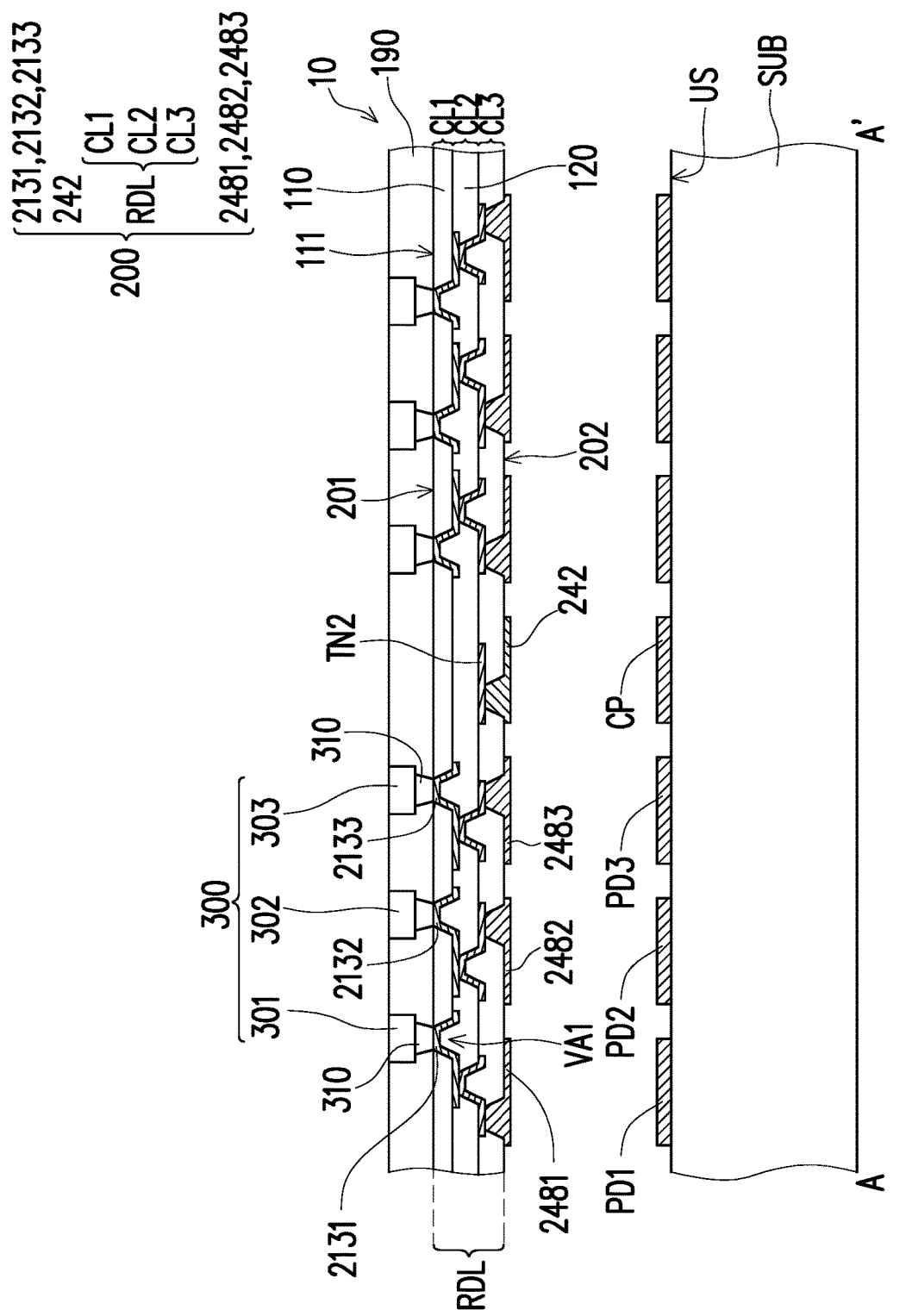
FIG. 1B is a cross-sectional view of the light emitting device of FIG. 1A along a section line A-A'.

FIG. 1A is a schematic top view of a light emitting device according to an embodiment of the disclosure. FIG. 1B is a cross-sectional view of the light emitting device of FIG. 1A along a section line A-A'. For the clarity of the drawings and the simplicity in description, FIG. 1A and FIG. 1B omit to show some of the components. In FIG. 1A and FIG. 1B, a light emitting device 1 includes a driving substrate SUB and a plurality of light emitting modules 10 disposed on the driving substrate SUB. In one embodiment, at least one of the light emitting modules 10 is disposed on the driving substrate SUB. In some embodiments, the light emitting modules 10 may be arranged in multiple horizontal rows or multiple vertical columns on the X-axis and/or Y-axis in an array. For example, the X-axis is, for example, a direction extending laterally, and the Y-axis is a direction extending vertically. In some embodiments, the X-axis is perpendicular to the Y-axis, and the Z-axis is perpendicular to the X-axis or the Y-axis. The Z-axis is, for example, the normal direction of the upper surface of the driving substrate SUB or the light emitting modules 10. The light emitting modules 10 of this embodiment may be electrically connected to the driving substrate SUB to emit light and/or display images by being bonded to the driving substrate SUB, so that the light emitting device 1 has the function of emitting light and/or displaying images.

In FIG. 1B, the driving substrate SUB of this embodiment is, for example, a base material including signal lines, and the base material includes a rigid substrate or a flexible substrate. In some embodiments, the material of the rigid substrate includes, for example, glass, quartz, ceramics, sapphire, etc., but it is not limited thereto. In some embodiments, the flexible substrate includes suitable flexible materials, such as polycarbonate (PC), polyimide (PI), polypropylene (PP), polyethylene terephthalate (PET), other suitable materials, or a combination of the foregoing materials, but it is not limited thereto. The material of the signal line provided on the substrate may be metal including copper, aluminum, titanium, other suitable materials, alloys of the foregoing materials, or combinations of the foregoing materials, the disclosure is not limited thereto. The driving substrate SUB may further include an insulating layer disposed on the signal line and the base material, wherein a surface of the insulating layer away from the signal line may be an upper surface US of the driving substrate SUB. On the upper surface US of the driving substrate SUB, a plurality of pads PD1, PD2, PD3, or pads CP may be provided to be electrically connected to the light emitting modules 10 in the subsequent process. In some embodiments, the driving substrate SUB is, for example, a printed circuit board (PCB) or a chip on film (COF), but it is not limited thereto.

In some embodiments, the light emitting module 10 includes a circuit structure 200 and a plurality of light emitting units 300. The circuit structure 200 may be defined as a structure including at least a circuit, which may include passive components (such as capacitors), active components (such as thin film transistors), or a circuit structure having both of the above, but it is not limited thereto. As shown in FIG. 1B, the circuit structure 200 includes a plurality of pads 2131, 2132, and 2133 disposed on a first side 201 of the circuit structure 200, and the circuit structure 200 also includes a plurality of pads 2481, 2482, and 2483 disposed on a second side 202 of the circuit structure 200 opposite to the first side 201. The circuit structure 200 further includes a redistribution circuit layer RDL disposed between the pads 2131, 2132, 2133 and the pads 2481, 2482, 2483. Take the redistribution circuit layer RDL in FIG. 1B as an example: the redistribution circuit layer RDL includes a stack of three circuit layers CL1, CL2, and CL3, but the number of the circuit layers is not limited to that shown in FIG. 1B. Instead, the number of the circuit layers may be increased or decreased, as it is adjusted according to the needs of product design. Each of the circuit layers includes a dielectric layer and connection circuits. Take the circuit layer CL1 as an example: the connection circuit includes, for example, a circuit extending on a surface of a dielectric layer 110, a connection portion disposed in an opening VA1 penetrating the dielectric layer 110, and the pad 2131 disposed on a bottom surface in the opening VA1 (for example, the top surface of the opening VA1 in FIG. 1B, which is the surface closest to the light emitting units 300). In some embodiments, the bottom surface may be defined as the surface of the opening VA1 that has the narrowest width. The upper surface of the pad 2131 may be aligned with the upper surface of the dielectric layer of the circuit layer CL1, but it is not limited thereto. The description of the structure of the connection circuit is further elaborated in the subsequent paragraphs in detail.

In some embodiments, the light emitting module 10 is, for example, an architecture in which the light emitting units 300 are first provided. The light emitting unit 300 is, for example, a light emitting diode, but it is not limited thereto. The light emitting unit 300 includes a first light emitting unit 301, a second light emitting unit 302, and a third light emitting unit 303. The first light emitting unit 301, the second light emitting unit 302, and the third light emitting unit 303 are, for example, light emitting units that emit light of the same color or light of different colors. For example, the first light emitting unit 301 emits red light, the second light emitting unit 302 emits green light, and the third light emitting unit 303 emits blue light, but it is not limited thereto. In other embodiments, the first light emitting unit 301, the second light emitting unit 302, and the third light emitting unit 303 emit light of the same color. In other embodiments, the light emitting unit 300 may also include light emitting units that emit yellow light, orange light, white light, or light in other suitable colors.

Figure 1C:
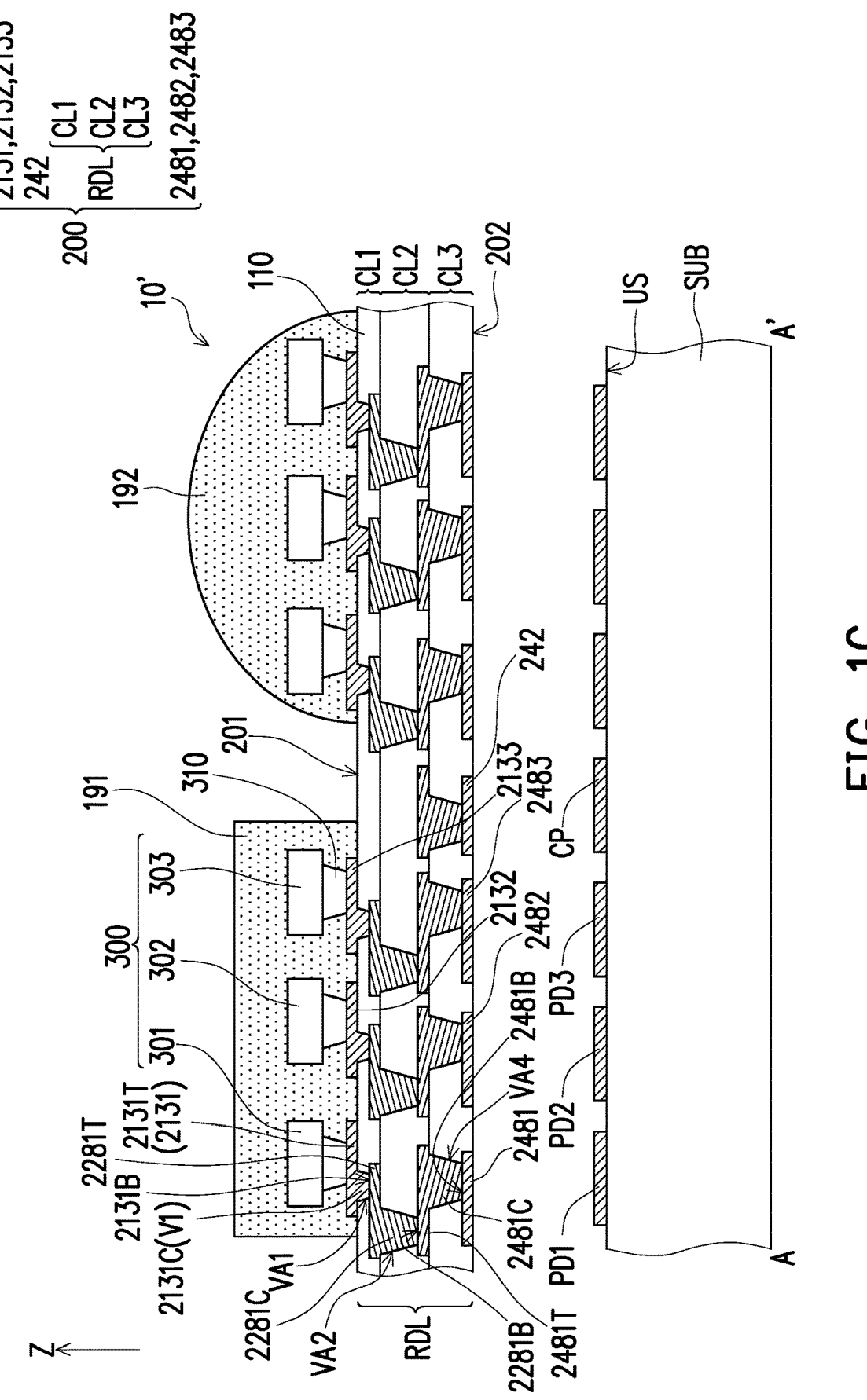
FIG. 1C is a cross-sectional view of a light emitting device according to another embodiment of the disclosure.

FIG. 1C is a cross-sectional view of a light emitting device according to another embodiment of the disclosure. The light emitting device of FIG. 1C is similar to the light emitting device of FIG. 1B, except that a light emitting module 10' in FIG. 1C has an architecture in which, for example, a circuit structure 200 is first provided. In the embodiment shown in FIG. 1C, a redistribution circuit layer RDL of the light emitting module 10' includes a stack of three circuit layers CL1, CL2, and CL3, but the number of the circuit layers is not limited to that shown in FIG. 1C. Instead, the number of the circuit layers may be increased or decreased, as it is adjusted according to the needs of product design. Each of the circuit layers includes a dielectric layer and connection circuits. Take the circuit layer CL1 as an example: the connection circuit includes, for example, a circuit extending on a surface of a dielectric layer 110, a connection portion disposed in an opening VA1 penetrating the dielectric layer 110, and a pad 2131B disposed on a bottom surface in the opening VA1 (for example, the surface in the opening VA1 away from the light emitting unit 300 in FIG. 1C). Specifically, the connection circuit includes a circuit extending on an upper surface of the dielectric layer 110. The circuit may include a pad 2131T on the upper surface of the dielectric layer 110. In some embodiments, the circuit may also extend on the lower surface of the dielectric layer 110. For this structure, please refer to the configuration of FIG. 1B.

The circuit (including the pad 2131T) of the connection circuit may be connected to a connection portion 2131C provided in the opening VA1 to penetrate the dielectric layer 110. The connection portion 2131C may be connected to the pad 2131B located on the bottom surface of the opening VA1. From another perspective, the pad 2131B may be seen the narrowest surface of the connection portion 2131C in the opening VAL but it is not limited thereto.

The connection circuit of the circuit layer CL2 includes a circuit disposed on the upper surface of the dielectric layer, and the circuit includes a pad 2281T. The pad 2131B of the circuit layer CL1 is disposed on the pad 2281T of the circuit layer CL2, and the pad 2131B is electrically connected to the pad 2281T. The connection circuit of the circuit layer CL2 further includes a connection portion 2281C disposed in an opening VA2 and a pad 2281B located on the bottom surface in the opening VA2. The connection portion 2281C penetrates the dielectric layer, and the pad 2281B may be the narrowest surface of the connection portion 2281C in the opening VA2, but it is not limited thereto.

The connection circuit of the circuit layer CL3 includes a circuit disposed on the upper surface of the dielectric layer, and the circuit includes a pad 2481T. The pad 2281B of the circuit layer CL2 is disposed on the pad 2481T of the circuit layer CL3, and the pad 2281B is electrically connected to the pad 2481T. The connection circuit of the circuit layer CL3 further includes a connection portion 2481C disposed in an opening VA3 and a pad 2481B located on the bottom surface in the opening VA3. The connection portion 2481C penetrates the dielectric layer, and the pad 2481B may be the narrowest surface of the connection portion 2481C in the opening VA3, but it is not limited thereto.

In some embodiments, the pad 2481B may be electrically connected to the pad 2481 on a second side 202, but it is not limited thereto. In other embodiments, the pad 2481B may be exposed from the second side 202 and be aligned with the second side 202.

In some embodiments, the light emitting module 10' further includes an encapsulation layer 191 or an encapsulation layer 192. The encapsulation layer 191 or the encapsulation layer 192 is disposed on a first side 201 and respectively covers the light emitting units 300. The material of the encapsulation layer 191 or the encapsulation layer 192 includes optical glue, plastic film material such as polyvinyl chloride (PVC), epoxy resin, or other transparent materials, but it is not limited thereto. The encapsulation layer 191 may be a rectangular cube whose upper surface is substantially flat, and the encapsulation layer 192 may be substantially a hemisphere with a curved surface, but it is not limited thereto.

In FIG. 1B and FIG. 1C, the circuit structure 200 of the light emitting module 10 or the light emitting module 10' of this embodiment includes the redistribution circuit layer RDL, the pads 2131, 2132, and 2133 arranged on the upper surface (which may be defined as the first side 201 of the circuit structure 200, which is the side where the uppermost surface of the light emitting module 10 or the light emitting module 10' as a whole is connected to the light emitting units 300) of the redistribution circuit layer RDL, and the pads 2481, 2482, 2483, and 242 arranged on the lower surface (which may be defined as the second side 202 of the circuit structure 200, which is the side where the lowermost surface of the light emitting module 10 or the light emitting module 10' as a whole is connected to the driving substrate SUB) of the redistribution circuit layer RDL. The light emitting unit 300 is disposed on the pads 2131, 2132, and 2133 on the first side 201 of the circuit structure 200. The pads 2481, 2482, 2483, and 242 of the second side 202 of the circuit structure 200 may be electrically connected to the driving substrate SUB through the pad PD1, the pad PD2, the pad PD3, or the pad CP. For example, the signal of the driving substrate SUB may be transmitted to the circuit structure 200. In this embodiment, since the degree of dispersion of the pads 2481, 2482, 2483, and 242 on the second side 202 of the circuit structure 200 may be greater than the degree of dispersion of the pads 2131, 2132, and 2133 on the first side 201 of the circuit structure 200, the distances between the pads 2481, 2482, 2483, and 242 of the second side 202 may be distributed more evenly, so as to reduce the risk of short circuit or the difficulty in bonding with the driving substrate. In addition, the distances between the pads 2481, 2482, 2483, and 242 of the second side 202 may be increased. Furthermore, since the pads 2481, 2482, 2483, and 242 of the second side 202 of the circuit structure 200 may be reconfigured or integrated through the redistribution circuit layer RDL, the number of pads on the second side 202 of the circuit structure 200 may be reduced. And the bonding quality of the light emitting module 10 or the light emitting module 10' and the driving substrate SUB may be improved. The light emitting device 1 may have better bonding quality or display quality.

Figure 2A:
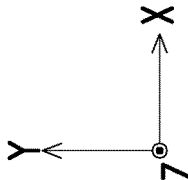
FIG. 2A is a schematic top view of a first circuit layer of a light emitting module according to an embodiment of the disclosure.
Figure 2B:
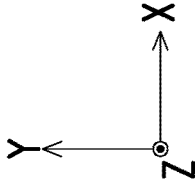
FIG. 2B is a schematic top view of a second circuit layer of a light emitting module according to an embodiment of the disclosure.
Figure 2C:
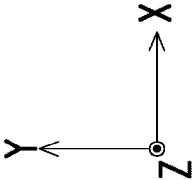
FIG. 2C is a schematic top view of a third circuit layer of a light emitting module according to an embodiment of the disclosure.
Figure 2D:
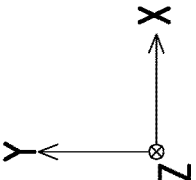
FIG. 2D is a schematic bottom view of a third circuit layer of a light emitting module according to an embodiment of the disclosure.

FIG. 2A is a schematic top view of a first circuit layer of a light emitting module according to an embodiment of the disclosure. FIG. 2B is a schematic top view of a second circuit layer of a light emitting module according to an embodiment of the disclosure. FIG. 2C is a schematic top view of a third circuit layer of a light emitting module according to an embodiment of the disclosure. FIG. 2D is a schematic bottom view of a third circuit layer of a light emitting module according to an embodiment of the disclosure. For the clarity of the drawings and the convenience of description, FIG. 2A to FIG. 2D omit to show some of the components. In FIG. 1B, FIG. 1C, and FIG. 2A, the circuit structure 200 of the light emitting module 10 includes the redistribution circuit layer RDL. The redistribution circuit layer RDL includes a plurality of circuit layers. FIG. 2A shows that an upper surface 111 of the first circuit layer CL1 is, for example, the uppermost layer of the redistribution circuit layer RDL, which is also the first side 201 of the circuit structure 200. The first circuit layer CL1 includes, for example, the dielectric layer 110 and connection circuits. The material of the dielectric layer 110 may be an organic insulating layer, including resin, epoxy, silicone, polydimethylsiloxane (PDMS), polyvinyl ester acid, polyvinyl ester, polychloroprene, or other suitable materials, but it is not limited thereto. With the above configuration, the thickness of the dielectric layer 110 ranges from 0.1 $\mu$m to 10 $\mu$m, but it is not limited thereto. In other embodiments, the material of the dielectric layer 110 may be an inorganic insulating layer, including silicon oxide ($SiO_x$), silicon nitride ($SiN_x$), aluminum oxide ($AlO_x$), or other suitable materials, but it is not limited thereto. With the above configuration, the thickness of the dielectric layer 110 ranges from 100 Å to 5000 Å, but it is not limited thereto.

The circuit structure 200 includes a plurality of first pads 2121, 2122, and 2123 disposed on the upper surface 111 of the first circuit layer CL1, a surface that is the first side 201 of the circuit structure 200. The circuit structure 200 further includes a plurality of third pads 2131, 2132, and 2133 disposed on the upper surface 111 of the first circuit layer CL1. The first pads 2121, 2122, and 2123 may be arranged to correspond to the third pads 2131, 2132, and 2133, respectively. For example, the first pad 2121 and the third pad 2131 may be provided in a pair. The first pads 2122 and 2123 may also be provided in pairs respectively with the third pads 2132 and 2133. Take the pair of pads formed by the first pad 2121 and the third pad 2131 as an example: the first pad 2121 and the third pad 2131 may be respectively connected to the first light emitting unit 301 of the light emitting unit 300. The first pad 2121 may be connected to the negative pole (the N pole) of the first light emitting unit 301 as a reference electrode. The third pad 2131 may be connected to the positive pole (the P pole) of the first light emitting unit 301 to serve as a driving electrode. The above configuration is only an example. In other embodiments, the first pad 2121 may be connected to the positive pole of the first light emitting unit 301, or the third pad 2131 may be connected to the negative pole of the first light emitting unit 301. In addition, the positive pole of the first light emitting unit 301 may be adapted as a reference electrode, and the negative pole may be adapted as a driving electrode. In other words, one of the two electrodes of the first light emitting unit 301 may be a reference electrode, and the other may be a driving electrode, but it is not limited thereto.

Correspondingly, the second light emitting unit 302 is electrically connected to the first pad 2122 and the third pad 2132, and the third light emitting unit 303 is electrically connected to the first pad 2123 and the third pad 2133. The first pads 2121, 2122, and 2123 may be connected to each other or may be electrically connected to a contact C11 through a circuit 214. The contact C11 is, for example, a part of the connection circuit of the first circuit layer CL1. The contact C11 includes, for example, a circuit (including an upper pad located on the upper surface 111) extending on the upper surface 111 and a connection portion provided in a via penetrating the dielectric layer 110, and the connection portion on the bottom surface in the via may be adapted as a lower pad. In other words, the contact C11 may include upper pads on the dielectric layer 110, lower pads under the dielectric layer 110, and connection portions connecting the upper pads and the lower pads. In the present disclosure, a pad may be defined as the part where contact is made with other external components or circuits in a connection circuit, a conductive via, or a contact. For example, the first pads 2121, 2122, and 2123 may be regarded as the pads of the circuit 214 for connecting an external component, such as the light emitting unit 300. In addition, the upper pad of the contact C11 may be connected to the circuit 214. In some embodiments, the connection portion of the contact C11 may pass through the dielectric layer 110, and the first pads 2121, 2122, and 2123 are integrated to the contact C11 through the circuit 214 to be led to the second circuit layer CL2 under the first circuit layer CL1 (which is further elaborated in FIG. 2B). With the above configuration, the first pads 2121, 2122, and 2123 may be adapted to be connected to a common voltage, and several pads may be integrated into the contact C11 to reduce the number of pads.

In some embodiments, the third pads 2131, 2132, and 2133 may be connected to a plurality of conductive vias V1, V2, and V3 through the circuits 214, respectively. Similar to the contact C11, the conductive vias V1, V2, and V3 may include upper pads on the dielectric layer 110, lower pads under the dielectric layer 110, and connection portions connecting the upper pads and the lower pads, so the same description is not repeated herein. The third pads 2131, 2132, and 2133 may be respectively connected to the upper pads of the conductive vias V1, V2, and V3 through the circuits 214. The connection portions of the conductive vias V1, V2, and V3 penetrate the dielectric layer 110 on the Z-axis to conduct the third pads 2131, 2132, and 2133 from the upper surface 111 to the second circuit layer CL2 under the first circuit layer CL1 (which is further elaborated in FIG. 2B). With the configuration mentioned above, the third pads 2131, 2132, and 2133 may be adapted to be connected to a driving voltage to drive the light emitting unit 300 to emit light or display images.

In some embodiments, the third pads 2131, 2132, and 2133 may have a width W2 on the X-axis. The width is defined as the maximum length of a component on the X-axis. For example, the width W2 is the maximum length of the third pad 2131 on the X-axis. The conductive vias V1, V2, and V3 may have widths on the X-axis, and the width W2 of the third pads 2131, 2132, and 2133 may be substantially the same as the widths of the conductive vias V1, V2, and V3, but it is not limited thereto. In some embodiments, the widths of the conductive vias V1, V2, and V3 may be larger or smaller than the width W2 of the third pads 2131, 2132, and 2133.

Please refer to FIG. 2A and FIG. 2B. FIG. 2B shows an upper surface 121 of the second circuit layer CL2. The upper surface 121 is disposed adjacent to the lower surface of the first circuit layer CL1. The second circuit layer CL2 includes a plurality of transfer nodes TN2, a plurality of contacts C21, a plurality of circuits 226, and the conductive vias V1, V2, and V3 penetrating the dielectric layer 120. In some embodiments, the transfer node TN2 may be a pad of the circuit 226, and may be arranged to correspond to the contact C11 penetrating the first circuit layer CL1, and the transfer node TN2 is electrically connected to the lower pad of the contact C11. The transfer nodes TN2 may be connected to each other through the circuit 226, or be integrated into the contact C21. Similar to the contact C11, the contact C21 may include upper pads on the dielectric layer 120, lower pads under the dielectric layer 120, and connection portions connecting the upper pads and the lower pads, and the connection portion penetrates the dielectric layer 120, so the same description is not repeated herein. With the above configuration, several transfer nodes TN2 may be integrated into the contact C21. In other words, the contacts C11 of the first circuit layer CL1 are integrated into the contact C21 through the transfer nodes TN2 and the circuits 226, and the number of the contacts C11 may be greater than the number of the contacts C21. Also, the number of the first pads 2121, 2122, and 2123 may be greater than the number of the contacts C11. In this way, the circuit structure 200 reduces the number of the first pads 2121, 2122, and 2123 (for example, 48) to the number of the contacts C21 (for example, 2) by reconfiguring and/or integrating the contacts or the transfer nodes of the circuit layer (for example, the first circuit layer CL1 and the second circuit layer CL2) in the redistribution circuit layer RDL to integrate the first pads 2121, 2122, and 2123 into the contacts C21. Therefore, the light emitting module 10 may reduce the risk of short circuit or reduce the difficulty in bonding with the driving substrate by reducing the number of the pads through the redistribution circuit layer of the circuit structure 200.

Please refer to FIG. 1B, FIG. 1C, FIG. 2B and FIG. 2C. An upper surface 131 of the third circuit layer CL3 in FIG.

2C faces the lower surface of the second circuit layer CL2. In some embodiments, the upper surface 131 of the third circuit layer CL3 contacts the lower surface of the second circuit layer CL2. The third circuit layer CL3 includes: a dielectric layer 130; a plurality of circuits 234 and 236, and a plurality of transfer nodes TN3 disposed on the upper surface 131; and a plurality of contacts 2381, 2382, and 2383 and a contact C31 penetrating the dielectric layer 130.

In some embodiments, the conductive vias V1, V2, and V3 may penetrate the dielectric layer 110 or the dielectric layer 120, and the bottom surfaces (i.e., the lower pads) of the conductive vias V1, V2, and V3 are exposed from the bottom surface of the dielectric layer 110 or the dielectric layer 120. A plurality of pads P1, P2, and P3 are disposed on the upper surface 131 and correspond to the bottom surfaces of the conductive vias V1, V2, and V3 to which they are electrically connected. The pads P1, P2, and P3 may be electrically connected to the contacts 2381, 2382, and 2383 through the circuits 234, respectively. Similar to the connection circuits or contacts of the first circuit layer CL1 or the second circuit layer CL2, the pads P1, P2, and P3 may be considered the pads of the circuit 234. The contacts 2381, 2382, and 2383 may include upper pads on the dielectric layer 130, lower pads under the dielectric layer 130, and connection portions connecting the upper pads and the lower pads, and the connection portion penetrates the dielectric layer 130, so the same description is not repeated herein. As shown in FIG. 2C, the contacts 2381, 2382, and 2383 may be arranged in an array on the X-axis and the Y-axis. For example, the contacts 2381 may be arranged in a line along the Y-axis. And the contacts 2382 may be arranged in a line along the Y-axis and be separated from the contacts 2381. The columns of the contacts 2382 and 2383 may be arranged on one side of the contact 2381 on the X-axis. The pattern of the circuit 234 between the connection pads P1, P2, and P3 and the contacts 2381, 2382, and 2383 is not limited to that shown in FIG. 2C. In some embodiments, the pad P1 may be connected to the driving voltage for driving the first light emitting unit 301, the pad P2 may be connected to the driving voltage for driving the second light emitting unit 302, and the pad P3 may be connected to the driving voltage for driving the third light emitting unit 303. With the configuration mentioned above, the third pads 2131, 2132, and 2133 may be redistributed on the redistribution circuit layer RDL through the pads P1, P2, and P3, the conductive vias V1, V2, and V3, the circuits 234, and the contacts 2381, 2382, and 2383. The reconfiguration described above is defined as follows: the conductive vias V1, V2, and V3 (for the pads P1, P2, and P3) and the contacts 2381, 2382, and 2383 may not overlap; the third pads 2131, 2132, and 2133 and the contacts 2381, 2382, and 2383 may not overlap; and the number of the third pads 2131, 2132, and 2133, the number of the conductive vias V1, V2, and V3, the number of the pads P1, P2, and P3, and the number of the contacts 2381, 2382, and 2383 may be the same, but it is not limited thereto.

In this way, the distance between the contacts 2381, 2382, and 2383 (and the pads they are connected to on the second side 202) may be evenly dispersed, thereby improving the degree of dispersion of the pads, increasing the distance between the pads, reducing the risk of short circuits, or reducing the difficulty in bonding the driving substrate. And the bonding quality of the light emitting module 10 or the light emitting module 10' and the driving substrate SUB may be improved. And the light emitting device 1 may have better bonding quality or display quality.

In some embodiments, the transfer nodes TN3 disposed on the upper surface 131 are, for example, pads, which are disposed to correspond to the bottom surface of the contacts C21 exposed from the lower surface of the second circuit layer CL2. The transfer nodes TN3 may be electrically connected to the bottom surfaces of the contacts C21. The transfer nodes TN3 may be electrically connected to the contacts C31 through the circuits 236. Similar to the contact C21, the contact C31 may include upper pads on the dielectric layer 130, lower pads under the dielectric layer 130, and connection portions connecting the upper pads and the lower pads, and the connection portion penetrates the dielectric layer 130, so the same description is not repeated herein. With the configuration above, several transfer nodes TN3 may be integrated into the contact C31 to be led to the other side of the third circuit layer CL3 through the connection portions of the contact C31. The number of the first pads 2121, 2122, and 2123 is greater than the number of the contacts C11, and it is also greater than the number of the contacts C21 and the number of the contacts C31. In this way, the circuit structure 200 is further reconfigured and/or integrated though the contacts or transfer nodes of the circuit layer in the redistribution circuit layer RDL to integrate the first pads 2121, 2122, and 2123 into the contact C31. In this way, the number of the first pads 2121, 2122, and 2123 is further reduced to the number of the contact C31 (for example, one). Therefore, the light emitting module 10 or the light emitting module 10' may effectively reduce the number of pads, the risk of short circuit, or the difficulty in bonding with the driving substrate through the redistribution circuit layer of the circuit structure 200.

In some embodiments, the arrangement patterns of the contacts 2381, 2382, and 2383 and the pads P1, P2, and P3 are not limited. On the Z-axis, the contacts 2381, 2382, and 2383 do not overlap the conductive vias V1, V2, and V3 or the pads P1, P2, and P3. On the Z-axis, the transfer node TN3 does not overlap the contacts 2381, 2382, and 2383. And the contact C31 does not overlap the contacts 2381, 2382, and 2383.

Please refer to FIG. 2C and FIG. 2D. A lower surface 132 of the third circuit layer CL3 shown in FIG. 2D is the second side 202 of the circuit structure 200. In some embodiments, as shown in FIG. 1B or FIG. 1C, it faces the upper surface US of the driving substrate SUB. The lower surface 132 of the third circuit layer CL2 contacts the lower surface of the second circuit layer CL2. And the connection circuits include, for example, pads 2481, 2482, and 2483.

In some embodiments, FIG. 2D shows the lower surface of the connection structure, that is, a plurality of fourth pads 2481, 2482, and 2483 on the second side 202 (as shown in FIG. 1B or FIG. 1C). The lower pad of the contact C31 may be located on the lower surface 132 of the third circuit layer CL3, that is, the second side 202 of the circuit structure 200, and be a second pad 242. In some embodiments, a width W6 of the second pad 242 may be the same as or different from a width of the fourth pads 2481, 2482, and 2483. For example, the width W6 of the second pad 242 in the X direction shown in FIG. 2D may be greater than the width of the fourth pad 2481, 2482 or 2483 in the X direction, but it is not limited thereto. In other embodiments, the width W6 of the second pad 242 in the X direction may be equal to or smaller than the width of the fourth pad 2481, 2482 or 2483 in the X direction. In some embodiments, the area of the second pad 242 on the lower surface 132 of the light emitting module 10 in FIG. 2D is larger than the area of one of the first pads 2121, 2122, and 2123 shown in FIG. 2A.

In some embodiments, the fourth pads 2481, 2482, and 2483 of the second side 202 penetrate the redistribution circuit layer RDL including the multilayer circuit layer through the contacts 2381, 2382, and 2383 and the conductive vias V1, V2, and V3 to be electrically connected to the third pads 2131, 2132, and 2133 on the first side 201. With the above configuration, the third pads 2131, 2132, and 2133 are reconfigured or integrated through the connection circuits in the redistribution circuit layer RDL to be electrically connected to the corresponding fourth pads 2481, 2482, and 2483. In this way, the number of the third pads 2131, 2132, and 2133 is equal to the number of the fourth pads 2481, 2482, and 2483. Consequently, the fourth pads 2481, 2482, and 2483 and the second pad 242 may be adapted as the pads on the lower surface of the light emitting module 10 to receive the driving signals of the pads PD1, PD2, PD3, and CP of the driving substrate SUB (shown in FIG. 1A and FIG. 1B). The driving signal may be transmitted to the third pads 2131, 2132, and 2133, the first pads 2121, 2122, and 2123, and the light emitting unit 300 connecting thereof through the fourth pads 2481, 2482, and 2483, the second pad 242, and the redistribution circuit layer RDL. In this way, the light emitting unit 300 may emit light or generate a display image after receiving the driving signal.

In some embodiments, the pads on the bottom surface of the contact C31 may be arranged to correspond to the second pads 242. In other embodiments, the bottom surface of the contact C31 may be adapted as the second pad 242, but it is not limited thereto. The second pad 242 on the second side 202 may be reconfigured or integrated through the connection circuit in the redistribution circuit layer RDL to be electrically connected to the first pads 2121, 2122, and 2123 on the first side 201. The redistribution circuit layer RDL is disposed between the first pads 2121, 2122, and 2123 and the second pad 242. Since the first pads 2121, 2122, and 2123 may be reconfigured or integrated through the connection circuits in the redistribution circuit layer RDL, the number of the first pads 2121, 2122, and 2123 may be greater than the number of the second pads 242.

It is worth noting that since the number of the first pads 2121, 2122, and 2123 may be reduced after the circuit reconfiguration or integration, the number of the second pads 242 provided on the second side 202 may be less than the number of the first pads 2121, 2122, and 2123. In addition, the transfer nodes TN2 and TN3 are adapted to integrate the first pads 2121, 2122, and 2123, and its number is smaller than the number of the first pads 2121, 2122, and 2123 and is greater than the number of the second pads 242. In addition, take the transfer node TN2 as an example: the width of the transfer node TN2, for example, in the X direction may be greater than the width of one of the first pads 2121, 2122, and 2123 in the X direction, and is smaller than the width of the second pad 242 in the X direction, but it is not limited thereto. In addition, the third pads 2131, 2132, and 2133 on the first side 201 may be reconfigured to the fourth pads 2481, 2482, and 2483 on the second side 202. In this way, the total number of pads on the second side 202 may be reduced, and the degree of dispersion of the second pad 242 and the fourth pads 2481, 2482, and 2483 may be greater than that of the first pads 2121, 2122, and 2123 and the third pads 2131, 2132, and 2133 on the first side 201 of the circuit structure 200, and therefore, the distance between the pads on the second side 202 may be distributed more evenly, the risk of short circuit may be reduced, or the difficulty in bonding with the driving substrate may be reduced. Furthermore, the distance between the pads on the second side 202 (including the fourth pads 2481, 2482, and

2483 and the second pad 242) may be increased. And since the pads on the second side 202 of the circuit structure 200 may be reconfigured or integrated through the redistribution circuit layer RDL, the number of pads on the second side 202 of the circuit structure 200 may be reduced. And the bonding quality of the light emitting module 10 or the light emitting module 10' and the driving substrate SUB may be improved. The light emitting device 1 may have better bonding quality or display quality.

In some embodiments, the first pad 2121, 2122, and 2123 and the second pad 242 may be configured to receive a common voltage, but it is not limited thereto. In other embodiments, the first pads 2121, 2122, and 2123 and the second pad 242 may also receive the driving voltage. In some embodiments, the common voltage or the driving voltage may be a direct current voltage or an alternating current voltage, but it is not limited thereto. The second pad 242 serves as a pad on the lower surface of the light emitting module 10 and receives the common voltage signal of the pad CP of the driving substrate SUB (shown in FIG. 1A and FIG. 1B). In other words, each of the light emitting modules 10 is electrically connected to the driving substrate SUB through the second pad 242. The common voltage signal may be transmitted to the first pads 2121, 2122, and 2123 and the light emitting unit 300 connected thereto through the second pad 242 and the redistribution circuit layer RDL. In this way, the number of the first pads 2121, 2122, and 2123 connected to the common signal may be reduced, the risk of short circuit may be reduced, or the difficulty in bonding with the driving substrate may be reduced. The bonding quality of the light emitting module 10 or the light emitting module 10' and the driving substrate SUB may be improved. And the light emitting device 1 may have better bonding quality or display quality.

Other embodiments are listed below for description. It must be noted here that the following embodiments adopt the element numbers and part of the content of the foregoing embodiments, wherein the same numbers are used to represent the same or similar elements, and the description of the same technical content is omitted. For the description of the omitted parts, reference may be made to the foregoing embodiments, so that the same description is not repeated in the following embodiments.

Figure 3A:
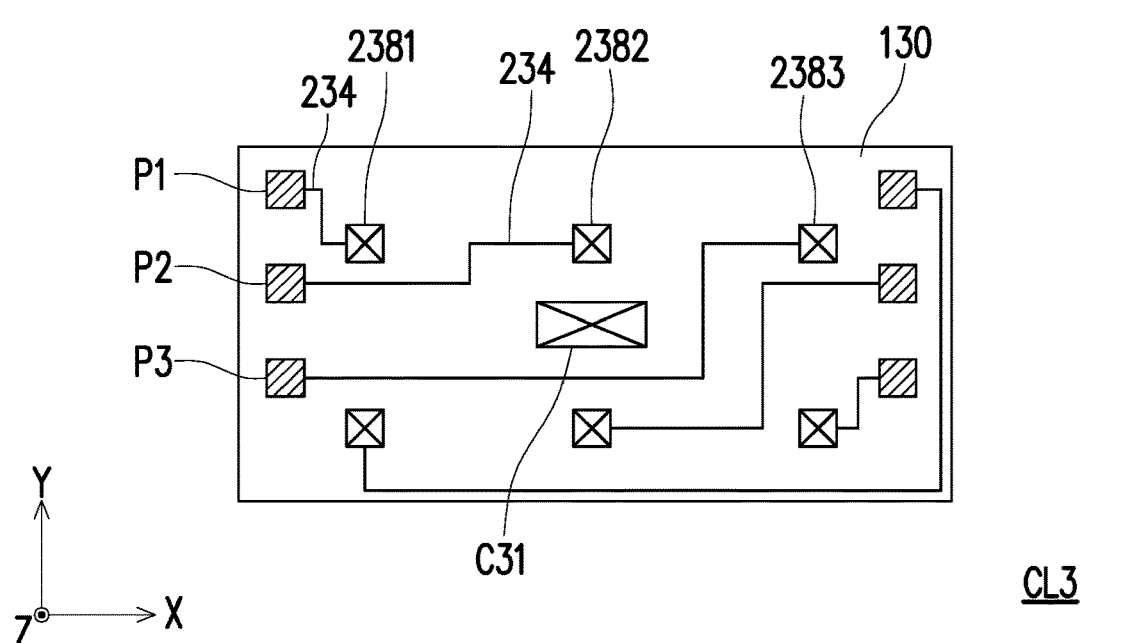
FIG. 3A is a schematic top view of a third circuit layer of a light emitting module according to another embodiment of the disclosure.

FIG. 3A is a schematic top view of a third circuit layer of a light emitting module according to another embodiment of the disclosure. The third circuit layer of this embodiment is generally similar to the third circuit layer of FIG. 2C, so the same and similar components in the two embodiments are not repeated here. Compared to the embodiment of FIG. 2C, the main difference in the embodiment of FIG. 3A is that the contact C31 may be arranged to correspond to the contact C11 and the transfer node TN2 in FIG. 2A and FIG. 2B. The connection portion of the contact C11 may penetrate the dielectric layer 110, so as to electrically connect the lower pad on the bottom surface with the upper pad of the transfer node TN2 on the dielectric layer 120. The connection portion of the transfer node TN2 then penetrates the dielectric layer 120 and is electrically connected to the upper pad of the contact C31 of the third circuit layer CL3. By analogy, in this embodiment, the circuit reconfiguration or integration may be performed through the bottom circuits of the redistribution circuit layer RDL (for example, the third circuit layer CL3). In addition, the area of the contact C31 may be larger than the area of the first pads 2121, 2122, and 2123, the conductive vias V1, V2, and V3, or the contacts 2381, 2382, and 2383, but it is not limited thereto. In addition, the contacts 2381, 2382, and 2383 may also be vias that penetrate the redistribution circuit layer RDL, and correspond to the positions of the fourth pads 2481, 2482, and 2483 on the lower surface 132 of the third circuit layer CL3 (in FIG. 2D). In this way, the circuit structure of this embodiment achieves the same technical effect as the foregoing embodiment.

Figure 3B:
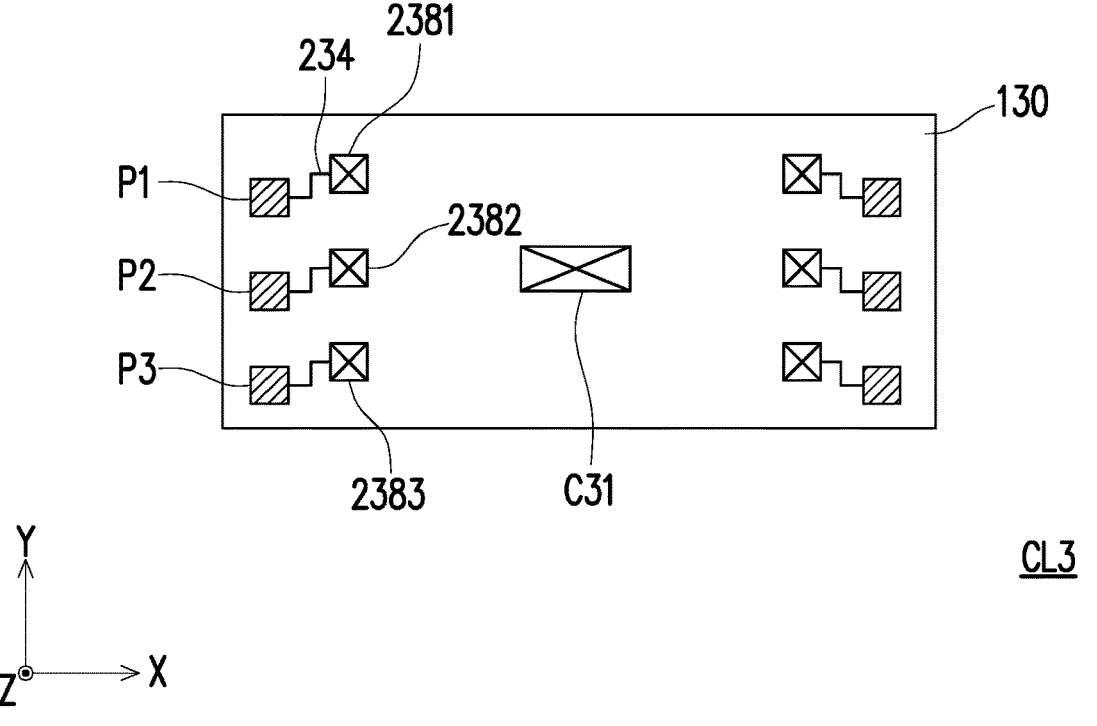
FIG. 3B is a schematic top view of a third circuit layer of a light emitting module according to another embodiment of the disclosure.

FIG. 3B is a schematic top view of a third circuit layer of a light emitting module according to another embodiment of the disclosure. The third circuit layer of this embodiment is generally similar to the third circuit layer of FIG. 2C, so the same and similar components in the two embodiments are not repeated here. Compared to the embodiment of FIG. 2C, the main difference in the embodiment of FIG. 3B is that the contacts 2381, 2382, and 2383 are respectively arranged adjacent to the corresponding pads P1, P2, and P3. The contacts 2381, 2382, and 2383 are electrically connected respectively to the pads P1, P2, and P3 through the circuits 234. After the contacts 2381, 2382, and 2383 penetrate the dielectric layer 130, they may be reconfigured or integrated through the connection circuits of other circuit layers. That is to say, the light emitting module of this embodiment rearranges the contacts in a layered manner by re-arranging multiple circuit layers in the redistribution circuit layer RDL, so as to gradually configure the third pads 2131, 2132, and 2133 to the positions of the fourth pads 2481, 2482, and 2483 as shown in FIG. 2D. In this way, the contacts 2381, 2382, and 2383 of the third circuit layer CL3 may not overlap or correspond to the positions of the fourth pads 2481, 2482, and 2483. In addition, the contact C31 does not have to penetrate all of the redistribution circuit layer RDL; instead, after penetrating the dielectric layer 130, it is reconfigured or integrated through the connection circuits of other circuit layers to configure the position of the second pad 242 as shown in FIG. 2D.

Figure 3C:
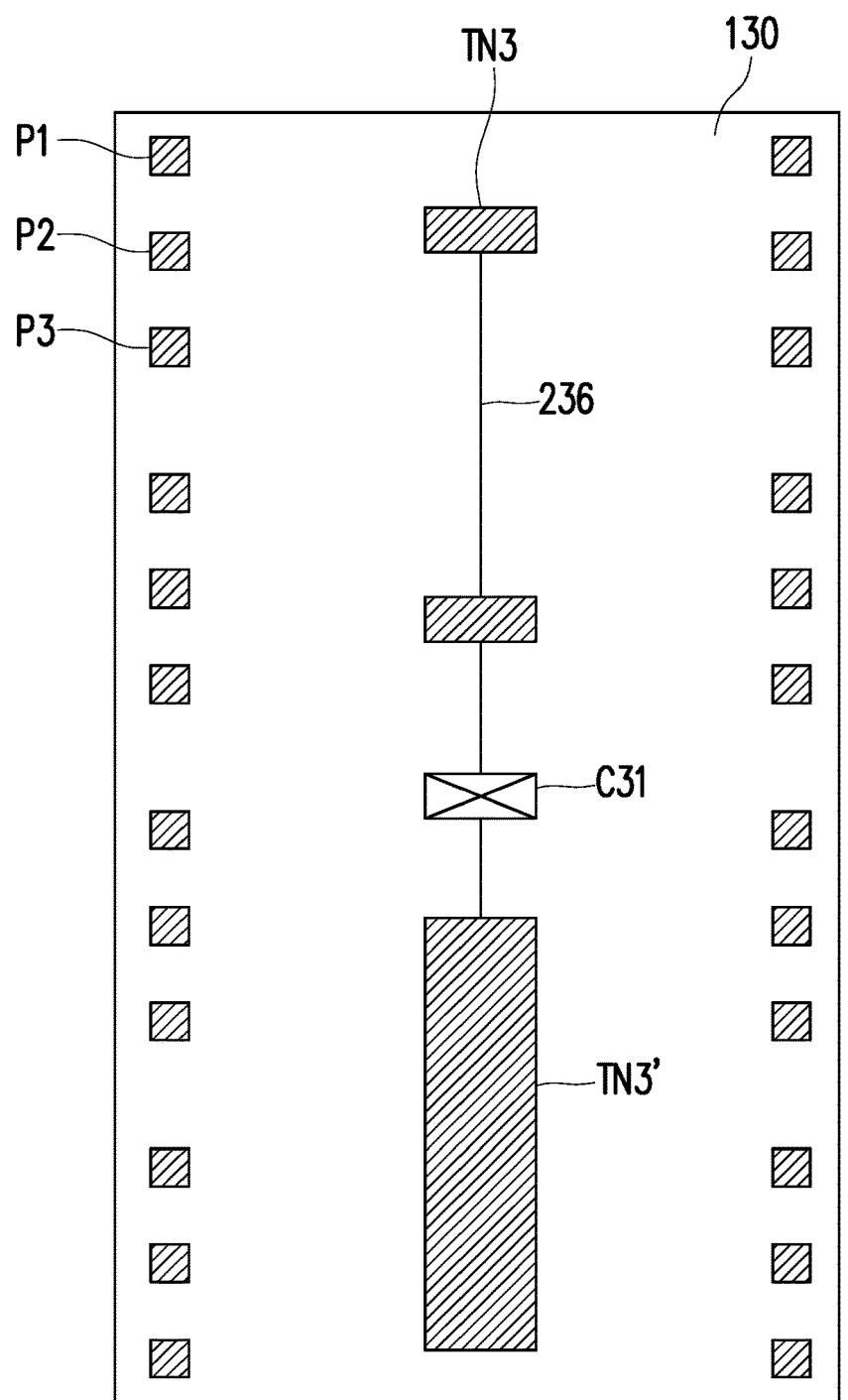
FIG. 3C is a schematic top view of a third circuit layer of a light emitting module according to another embodiment of the disclosure.
Figure 3C:
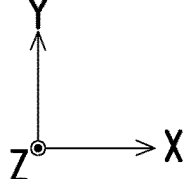

FIG. 3C is a schematic top view of a third circuit layer of a light emitting module according to another embodiment of the disclosure. The third circuit layer of this embodiment is generally similar to the third circuit layer of FIG. 2C, so the same and similar components in the two embodiments are not repeated here. Compared to the embodiment of FIG. 2C, the main difference in the embodiment of FIG. 3C is that several small-area transfer nodes may be integrated into a large-area transfer node, or the areas of the transfer nodes on the same circuit layer may be different. For example, the transfer node TN3 may be electrically connected to the contact C31 through the circuit 226 for the circuit reconfiguration or integration. In addition, the area of the part of the transfer node TN3' may be larger than the area of the transfer node TN3. For example, the area of the transfer node TN3' may be 2 to 10 times the area of the transfer node TN3, but it is not limited thereto. In some embodiments, the contacts C11 and C21 of the first circuit layer CL1 or the second circuit layer CL2 may be electrically connected to the transfer node TN3' after penetrating the dielectric layer 110 or the dielectric layer 120. In this way, the large-area transfer node TN3' may integrate the contact C11 and the contact C21, further reducing the number of pads and transfer nodes. The large-area transfer node TN3' reduces the impedance and further improves the electrical quality of the light emitting module 10.

Figure 4:
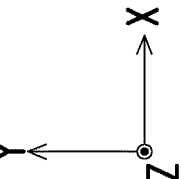
FIG. 4 is a schematic top view of a third circuit layer of a light emitting module according to another embodiment of the disclosure.

FIG. 4 is a schematic top view of a third circuit layer of a light emitting module according to another embodiment of the disclosure. The third circuit layer of this embodiment is generally similar to the third circuit layer of FIG. 2C, so the same and similar components in the two embodiments are not repeated here. Compared to the embodiment of FIG. 2C, the main difference in the embodiment of FIG. 4 is that a third circuit layer is divided into two sides on opposite sides of a center line M. On the left side of the center line M in FIG. 4, a pad P1 of a third circuit layer CL3 may be connected to an upper pad of a contact 2381 through a circuit 234. In this embodiment, in the third circuit layer CL3, only the pad P1 is electrically connected to the contact 2381 to achieve the circuit reconfiguration and/or integration of the contact 2281, such that mutual interference of signals and/or noise may be reduced, and electrical quality may be improved. A contact 2382 or a contact 2383 may perform the circuit reconfiguration and/or integration respectively on other circuit layers (for example, the fourth circuit layer or the fifth circuit layer).

On the right side of the middle line M in FIG. 4, the third circuit layer CL3 selectively configures the contacts 2381, 2382, and 2383 and electrically connect to the pads P1, P2, and P3, respectively. For example, the pad P2 may be electrically connected to the contact 2382 through the circuit 234. The pads adjacent to the pad P2 on the Y-axis do not undergo the circuit reconfiguration and/or integration at this time, and after an interval provided by the pad P3 on the Y-axis, the pad P1 may be electrically connected to the contact 2381 through the circuit 234. Then, after an interval provided by the pad P2 on the Y-axis, the pad P3 may be electrically connected to the contact 2383 through the circuit 234. That is, as every two electrically connected pads are separated by a pad that is not electrically connected, the number of contacts or circuits for the circuit reconfiguration and/or integration may be reduced, and the mutual interference of signals and/or noise may be reduced, and the electrical quality may be improved. In addition, the light emitting module of this embodiment may achieve the same technical effects as the previous embodiments.

Figure 5:
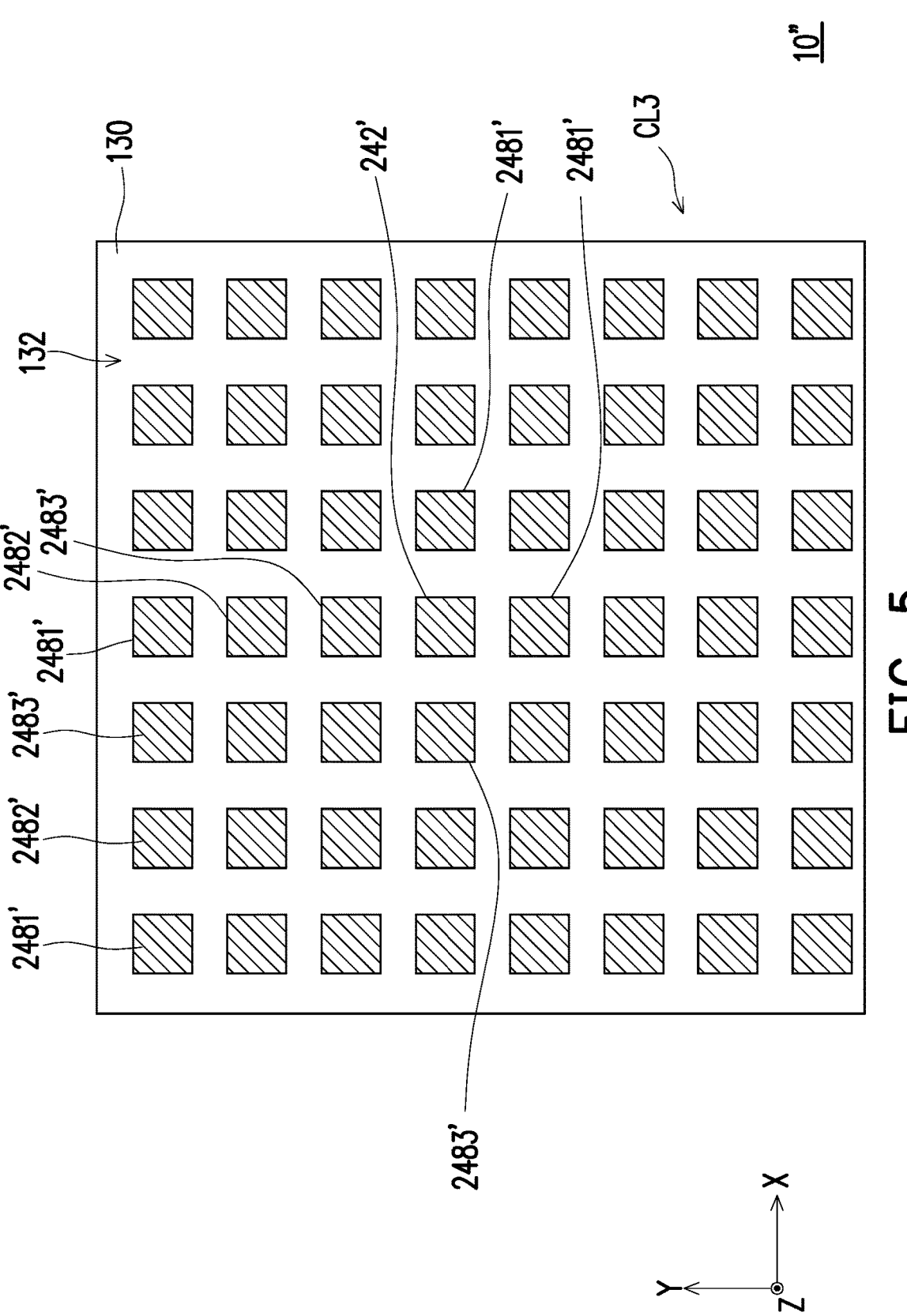
FIG. 5 is a schematic bottom view of a third circuit layer of a light emitting module according to another embodiment of the disclosure.

FIG. 5 is a schematic bottom view of a third circuit layer of a light emitting module according to another embodiment of the disclosure. The third circuit layer of this embodiment is generally similar to the third circuit layer of FIG. 2D, so the same and similar components in the two embodiments are not repeated here. Compared to the embodiment of FIG. 2D, the main difference in the embodiment of FIG. 5 is that what FIG. 5 shows is the lower surface 132 of the third circuit layer CL3 (that is, a second side of a light emitting module 10" as a whole). In this embodiment, the area of fourth pads 2481', 2482', and 2483' on the lower surface 132 of the light emitting module 10" is larger than the area of the third pads 2131, 2132, and 2133 shown in FIG. 2A. In some embodiments, the areas of the third pads 2131, 2132, and 2133 and that of other contacts in the redistribution circuit layer RDL (for example, the contacts 2381, 2382, and 2383 of the third circuit layer CL3 shown in FIG. 2C) may be the same, such that the areas of the fourth pads 2481', 2482', and 2483' of the third circuit layer CL3 are increased. In other embodiments, the areas of contacts of different circuit layers in the redistribution circuit layer RDL may gradually increase. For example, the areas of the contacts 2381, 2382, and 2383 of the third circuit layer CL3 may be larger than the area of the third pads 2131, 2132, and 2133, and the areas of the fourth pads 2481', 2482', 2483' may be larger than the areas of the contacts 2381, 2382, and 2383 or larger than the area of the third pads 2131, 2132, and 2133, but it is not limited thereto. Since the circuit structure of the light emitting module 10" may reduce the number of pads, reduce the risk of short circuit, increase the area of the pads, or reduce the difficulty in bonding with the driving substrate SUB, the bonding quality of the light emitting module 10" and the driving substrate SUB may be improved.

In addition, the position of the second pad 242' may be reconfigured to be surrounded by the fourth pads 2481', 2483', and/or 2482'. Moreover, the distance between the second pad 242' and the fourth pads 2481', 2483', and/or 2482' may be approximately the same, or may be distributed evenly to have a better degree of dispersion, such that the bonding quality of the light emitting module 10" and the driving substrate SUB may be improved. The definition of the degree of dispersion is explained in subsequent paragraphs. In addition, the light emitting module of this embodiment may achieve the same technical effects as the previous embodiments.

Figure 6A:
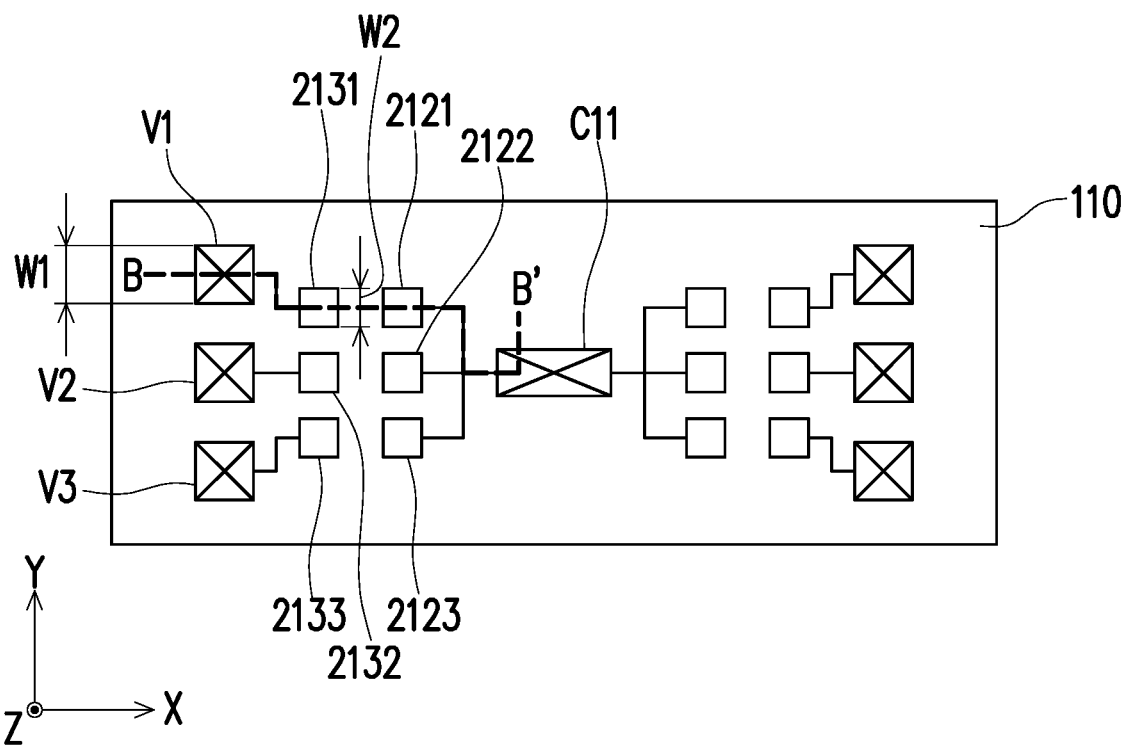
FIG. 6A is a schematic top view of a light emitting module according to another embodiment of the disclosure.

FIG. 6A is a schematic top view of a light emitting module according to another embodiment of the disclosure. The circuit structure of this embodiment is generally similar to the circuit structure of FIG. 2A, so the same and similar components in the two embodiments are not repeated here. The light emitting module 10 shown in FIG. 6A is, for example, an architecture in which a circuit structure is first provided. Compared to the embodiment of FIG. 2A, the main difference in the embodiment of FIG. 6A is that a width W1 of conductive vias V1, V2, and V3 in a Y direction is larger than a width W2 of third pads 2131, 2132, and 2133 in the Y direction. In this embodiment, since the pads or vias appear to be square in the top view of the Z-axis, the width on the X-axis may be substantially the same as the width on the Y-axis. In some embodiments, in the top view of the Z-axis, the areas of the conductive vias V1, V2, and V3 are larger than the areas of the third pads 2131, 2132, and 2133. In addition, the width or area of the third pads 2131, 2132, and 2133 may be equal to the width or area of the first pads 2121, 2122, and 2123, but it is not limited thereto.

Figure 6B:
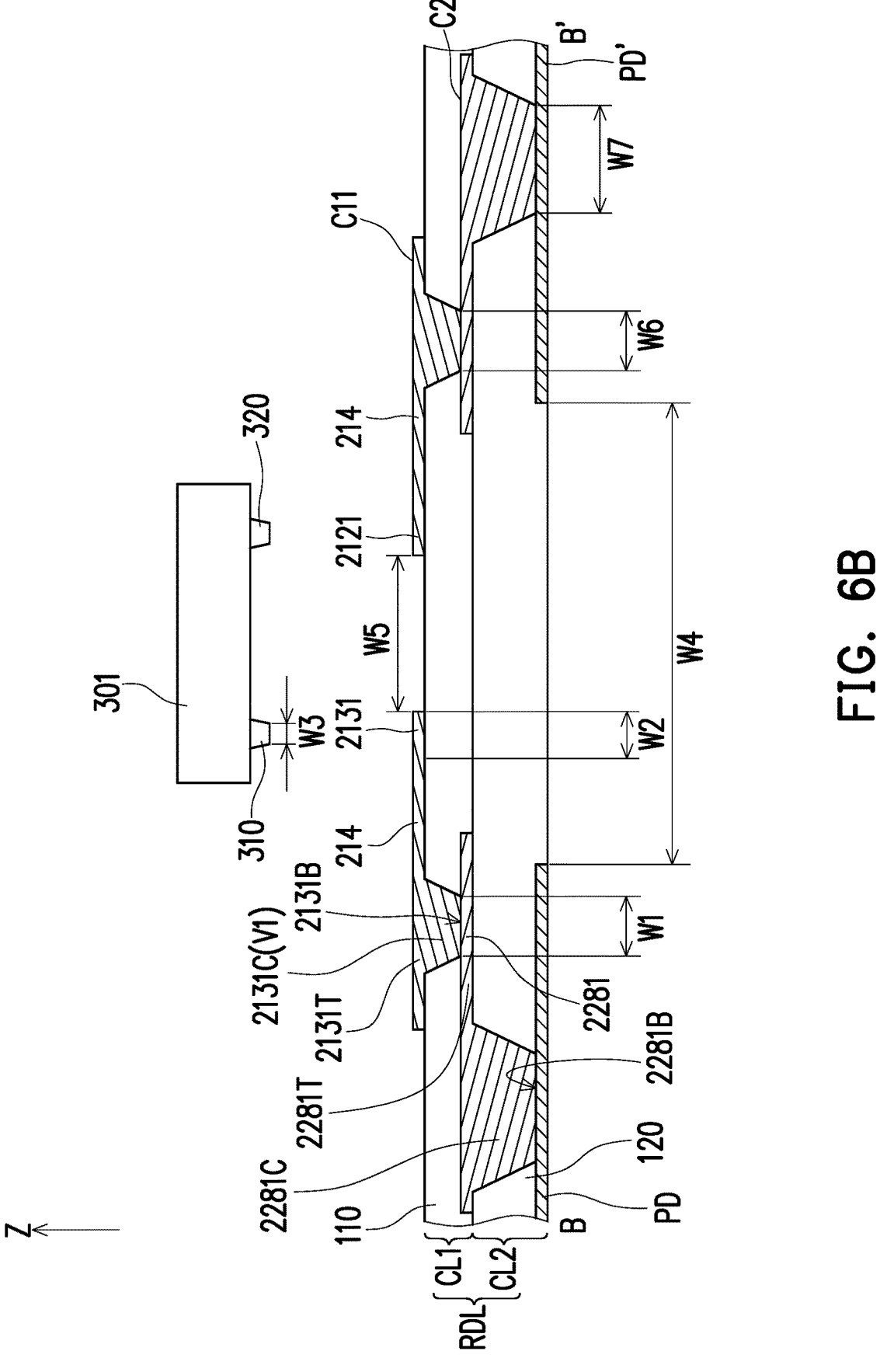
FIG. 6B is a cross-sectional view of the light emitting module of FIG. 6A along a section line B-B'.

FIG. 6B is a cross-sectional view of the light emitting module of FIG. 6A along a section line B-B'. For the clarity of the drawing and the convenience of description, several elements are omitted in FIG. 6B. Please refer to FIG. 1C, FIG. 6A, and FIG. 6B. FIG. 6B shows a light emitting module in which a circuit layer is first provided in the manufacturing process. The light emitting module of the embodiment in FIG. 6B is similar to that in FIG. 1C, so the same and similar components in the two embodiments are not repeated here. For example, in the light emitting module, the redistribution circuit layer RDL of the circuit structure is manufactured first, before the light emitting unit 300 (for example, the first light emitting unit 301) is bonded to the first pad 2121 and the third pad 2131 of the circuit structure.

For example, the redistribution circuit layer RDL includes two circuit layers CL1 and CL2. The first circuit layer CL1 is, for example, the uppermost circuit layer, and the second circuit layer CL2 is the lowermost circuit layer. The first circuit layer CL1 includes a dielectric layer 110 and a connection circuit. The connection circuit includes, for example, a circuit 214 extending on the upper surface of the dielectric layer 110 and a connection portion 2131C penetrating the dielectric layer 110. Specifically, the upper surface of the dielectric layer 110 is provided with a first pad 2121, a third pad 2131, and a contact C11. The circuit 214 connects the third pad 2131 to the upper pad 2131T of the conductive via V1. The conductive via V1 includes an upper pad 2131T on the dielectric layer 110, a lower pad 2131B, and a connection portion 2131C connecting the upper pad 2131T and the lower pad 2131B, and the connection portion 2131C penetrates the dielectric layer 110, so the same description is not be described again. As mentioned above, the lower pad 2131B may be defined as the bottom surface of the connection portion 2131C of the conductive via V1. The circuit 214 connects the first pad 2121 to the upper pad of the contact C11. As mentioned, the contact C11 includes an upper pad on the dielectric layer 110, a lower pad, and a connection portion connecting the upper pad and the lower pad, and the connection portion penetrates the dielectric layer 110, so the same description is not be described again. The second circuit layer CL2 includes the dielectric layer 120 and the connection circuit. The connection circuit includes, for example, a circuit extending on the upper surface of the dielectric layer 120 and a connection portion 2281C penetrating the dielectric layer 120. Specifically, the dielectric layer 120 is provided with the contact 2281 and the contact C21. The upper pad 2281T of the contact 2281 contacts the lower pad 2131B of the conductive via V1. The connection portion 2281C of the contact 2281 penetrates the dielectric layer 120 and connects the upper pad 2281T and the lower pad 2281B. As mentioned, the upper pad of the contact C21 contacts the lower pad of the contact C11. The connection portion of the contact C21 penetrates the dielectric layer 120 and connects the upper pad and the lower pad. A pad PD and a pad PD' are provided on the lower surface of the dielectric layer 120. The lower pad 2281B of the contact 2281 contacts the pad PD. The lower pad of the contact C21 contacts the pad PD'. In some embodiments, the pads or the contacts may be a single layer of metal including molybdenum (Mo), titanium (Ti), tantalum (Ta), niobium (Nb), hafnium (Hf), nickel (Ni), chromium (Cr), cobalt (Co), zirconium (Zr), tungsten (W), aluminum (Al), copper (Cu), argentum (Ag), other suitable conductive metals, or alloys or combinations of the above materials, but it is not limited thereto. In some embodiments, the composition of the pads and the contacts may also be a stack of multiple metal layers, and its thickness may be 100 Å to 2000 Å, but it is not limited thereto.

The third pad 2131 is connected to the conductive via V1 through the circuit 214. The first pad 2121 is electrically connected to the contact C11. The conductive via V1 penetrates the dielectric layer 110 to be electrically connected to the contact 2281. The contact C11 penetrates the dielectric layer 110 to be connected to the contact C21. The contact 2281 penetrates the dielectric layer 120 to be electrically connected to the pad PD. The contact C21 penetrates the dielectric layer 120 to be electrically connected to the pad PD'. In this way, the third pad 2131 on the first side is connected to the pad PD on the second side through the circuit reconfiguration and/or integration of the redistribution circuit layer RDL. The pad PD may be the fourth pad of the foregoing embodiment. The first pad 2121 on the first side is connected to the pad PD' on the second side through the circuit reconfiguration and/or integration of the redistribution circuit layer RDL. The pad PD' may be the second pad of the foregoing embodiment. The pad PD and the pad PD' may be connected to the driving substrate in the subsequent process, but it is not limited thereto.

The first light emitting unit 301 is electrically connected to the first pad 2121 and the third pad 2131. A first electrode 310 of the first light emitting unit 301 is, for example, a positive electrode, and is electrically connected to the third pad 2131 to receive a driving voltage signal. The second electrode 320 is, for example, a negative electrode, and is electrically connected to the first pad 2121 to receive a common voltage signal, but it is not limited thereto.

Please refer to FIG. 6A and FIG. 6B at the same time. In some embodiments, the width W3 of the first electrode 310 is smaller than the width W2 of the third pad 2131. The width W2 of the third pad 2131 is smaller than the width W1 of the conductive via V1. The width W1 of the conductive via V1 may be defined as the maximum distance of the bottom of the conductive via V1 in the opening of the dielectric layer 110, that is, the width of the lower pad 2131B. Based on the consideration of improving the bonding quality and/or yield rate, the width W2 of the third pad 2131 is greater than the width W3 of the electrode 310. In addition, in order to reduce impedance or to avoid the problem of signal variation due to impedance during switching, the width W1 of the conductive via V1 may be increased to be greater than the width W2 of the third pad 2131. In addition, in order to correspond to the re-integrated interconnection circuits, and/or to reduce circuit coupling problems or to reduce abnormal signal transmission, a spacing width W5 between the first pad 2121 and the third pad 2131 in the X direction is smaller than a spacing width W4 between the pad PD and the pad PD' in the X direction.

In addition, the thickness of the dielectric layer 110 of the first circuit layer CL1 may be set to be smaller than the thickness of the dielectric layer 120 of the second circuit layer CL2. The thickness mentioned above is defined as the maximum distance of the dielectric layer on the Z-axis. By increasing the thickness of the dielectric layer close to the bottommost layer, the influence of circuit coupling may be reduced. Furthermore, the volumes of the contact 2281 and the contact C21 in the second circuit layer CL2 may be increased. For example, a width W6 of the lower pad of the contact C11 at the bottom of the opening in the dielectric layer 110 is smaller than a width W7 of the lower pad of the contact C21 at the bottom of the opening in the dielectric layer 120. In this way, the volume of the contact C21 is greater than the volume of the contact C11. Similarly, the volume of the contact 2281 is greater than the volume of the conductive via V1. In this way, the problem of circuit coupling or abnormal signal transmission may be further reduced.

Figure 7A:
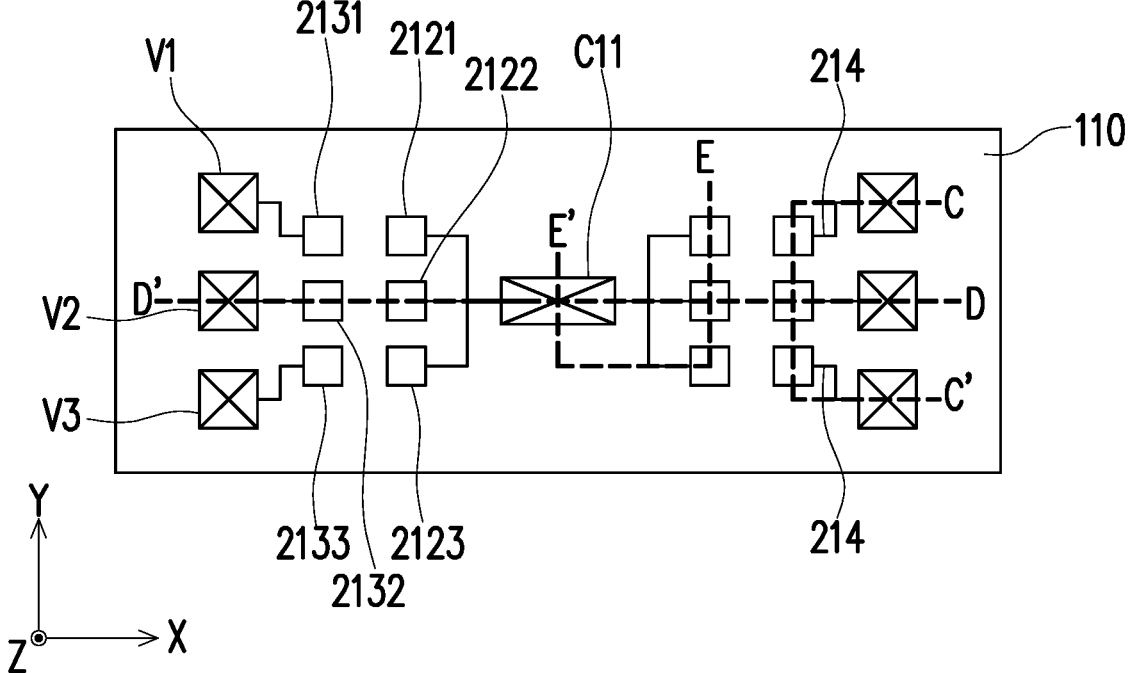
FIG. 7A is a schematic top view of a light emitting module according to another embodiment of the disclosure.
Figure 7B:
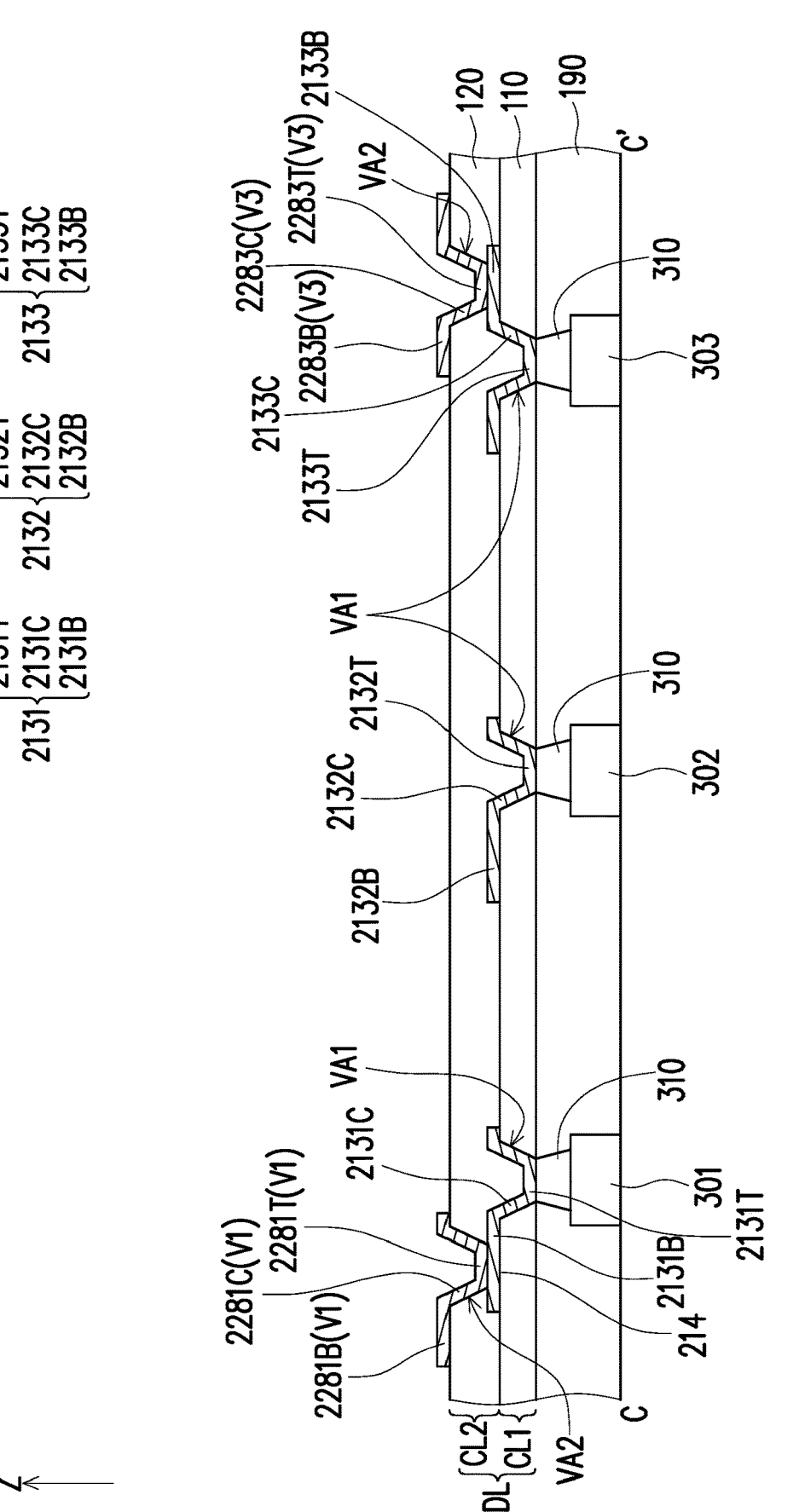
FIG. 7B is a cross-sectional view of the light emitting module of FIG. 7A along a section line C-C'.

FIG. 7A is a schematic top view of a light emitting module according to another embodiment of the disclosure. FIG. 7B is a cross-sectional view of the light emitting module of FIG. 7A along a section line C-C'. For the clarity of the drawing and the convenience of description, several elements are omitted in FIG. 7A. The light emitting module shown in FIG. 7A is, for example, an architecture in which light emitting units are first provided. The circuit structure of this embodiment is generally similar to the circuit structure of FIG. 1B or FIG. 6B, so the same and similar components in the two embodiments are not repeated here. Compared to the embodiment of FIG. 6B, the main difference in the embodiment of FIG. 7B is that the light emitting module shown in FIG. 7B is a light emitting module where the light emitting units are first provided in the manufacturing process. For example, the light emitting units 300 are provided first, before the redistribution circuit layer RDL of the circuit structure is manufactured on the light emitting units 300.

For example, the first light emitting unit 301, the second light emitting unit 302, and the third light emitting unit 303 are disposed on a temporary carrier (not shown in the drawings). Then, the first light emitting unit 301, the second light emitting unit 302, and the third light emitting unit 303 are encapsulated by an encapsulation layer 190. The encapsulation layer 190 includes a plastic film material or epoxy resin, but it is not limited thereto. The encapsulation layer 190 may expose the first electrode 310.

Next, a redistribution circuit layer RDL is provided on the encapsulation layer 190. The redistribution circuit layer RDL includes two circuit layers CL1 and CL2. The dielectric layer 110 of the first circuit layer CL1 includes a plurality of openings VA1, and the third pads 2131, 2132, and 2133 are respectively filled into the openings VA1 to be electrically connected to the first electrode 310. Specifically, the first circuit layer CL1 includes a dielectric layer 110 and a connection circuit. The connection circuit includes a circuit extending on the surface of the dielectric layer 110, a pad, and a connection portion penetrating the dielectric layer 110. The third pad 2131 includes the lower pad 2131B disposed on the surface of the dielectric layer 110, the upper pad 2131T at the bottom of the opening VA1, and the connection portion 2131C that penetrates the opening VA1 and connects the lower pad 2131B and the upper pad 2131T. The lower pad 2131B is connected to the circuit 214 disposed on the surface of the dielectric layer 110. Similarly, the third pad 2132 includes a lower pad 2132B disposed on the surface of the dielectric layer 110, an upper pad 2132T at the bottom of the opening, and a connection portion 2132C that penetrates the opening and connects the lower pad 2132B and the upper pad 2132T. The third pad 2133 includes a lower pad 2133B disposed on the surface of the dielectric layer 110, an upper pad 2133T at the bottom of the opening, and a connection portion 2133C that penetrates the opening and connects the lower pad 2133B and the upper pad 2133T. The upper pads 2131T, 2132T, and 2133T are electrically connected respectively to the first electrodes 310 of the light emitting elements 301, 302, and 303. The dielectric layer 120 of the second circuit layer CL2 is disposed on the dielectric layer 110 and has a plurality of openings VA2. Specifically, the second circuit layer CL2 includes a dielectric layer 120 and a connection circuit. The connection circuit includes a circuit extending on the surface of the dielectric layer 120, a conductive via, and a connection portion penetrating the dielectric layer 120. The conductive via V1 includes a lower pad 2281B disposed on the surface of the dielectric layer 120, an upper pad 2281T located at the bottom of the opening VA2, and a connection portion 2281C that penetrates the opening VA2 and connects the lower pad 2281B and the upper pad 2281T. The upper pad 2281T is electrically connected to the circuit 214 and the lower pad 2131B. Similarly, the conductive via V3 includes a lower pad 2283B disposed on the surface of the dielectric layer 120, an upper pad 2283T at the bottom of the opening, and a connection portion 2283C that penetrates the opening and connects the lower pad 2283B and the upper pad 2283T. The upper pad 2283T is electrically connected to the circuit 214 and the lower pad 2133B.

The lower pads 2281B and 2283B may be adapted to connect external components or circuits. In some embodiments, the lower pads 2281B and 2283B may be the fourth pads on the second side adapted for electrically connecting to the pads of the driving substrate. The conductive vias V1 and V3 may be electrically connected to the circuit 214 or the third pads 2131 and 2133 through the openings VA1 and VA2. And after the above process is completed, the entire light emitting module is separated from the temporary carrier, and the light emitting module is transferred to a target substrate with circuits (for example, the driving substrate SUB shown in FIG. 1B).

Figure 7C:
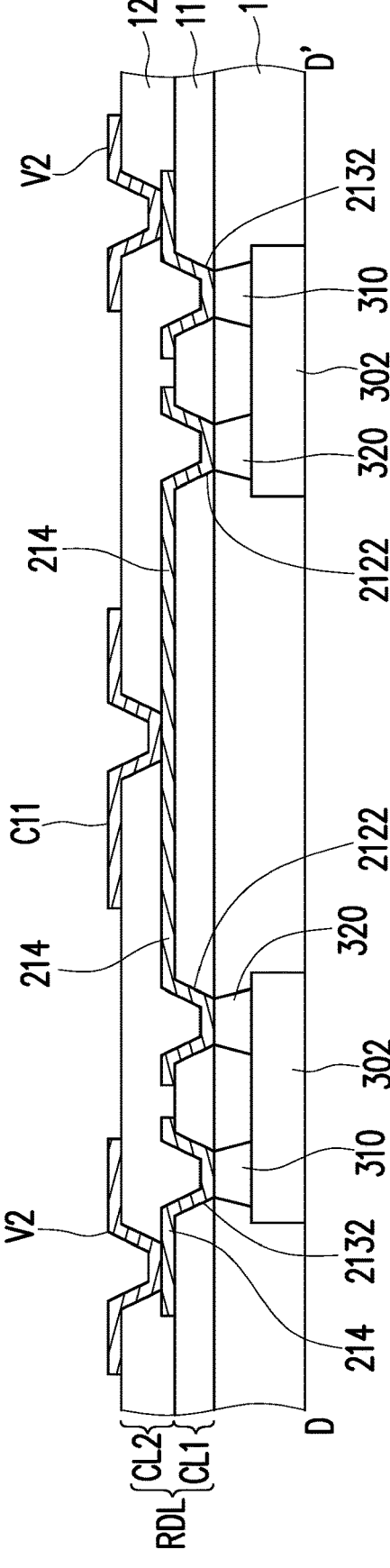
FIG. 7C is a cross-sectional view of the light emitting module of FIG. 7A along a section line D-D'.

FIG. 7C is a cross-sectional view of the light emitting module of FIG. 7A along a section line D-D'. For the clarity of the drawing and the convenience of description, several elements are omitted in FIG. 7C. In FIG. 7A and FIG. 7C, the connection portion and the upper pad of the conductive via V2 may be electrically connected to the circuit 214 or the third pad 2132 through the opening. The first electrode 310 of the second light emitting unit 302 may be electrically connected to the third pad 2132. Also, the second electrode 320 of the second light emitting unit 302 may be electrically connected to the first pad 2122, and the first pad 2122 may be electrically connected to the contact C11 through the circuit 214. In some embodiments, the second electrodes

320 of the two adjacent second light emitting units 302 are each electrically connected to the first pad 2122 and may be connected to the contact C11 through the circuits 214 on the same layer to achieve integrating or reducing the pads.

Figure 7D:
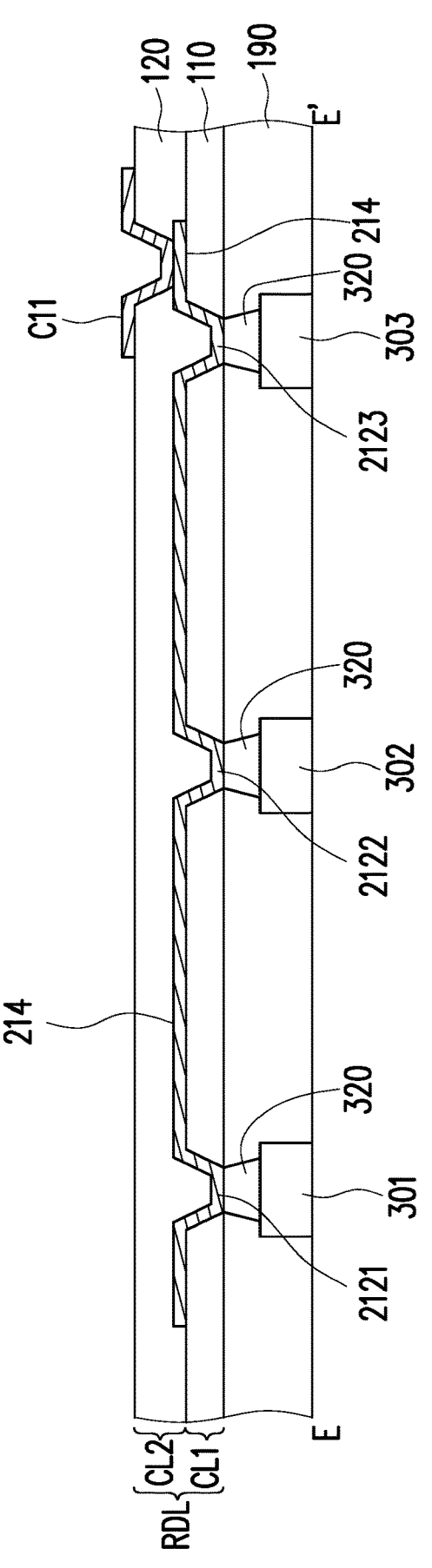
FIG. 7D is a cross-sectional view of the light emitting module of FIG. 7A along a section line E-E'.

FIG. 7D is a cross-sectional view of the light emitting module of FIG. 7A along a section line E-E'. For clarity of the drawings and convenience of description, several elements are omitted in FIG. 7D. In FIG. 7A and FIG. 7D, the second electrodes 320 of the first light emitting unit 301, the second light emitting unit 302, and the third light emitting unit 303 are respectively connected to the first pads 2121, 2122, and 2123. The first pads 2121, 2122, and 2123 are electrically connected to the circuit 214 on the same layer, and are electrically connected to the upper pad of the contact C11. That is to say, the first light emitting unit 301, the second light emitting unit 302, and the third light emitting unit 303 may be connected in series to the same contact C11 to integrate or reduce pads.

Please refer to FIG. 1B, FIG. 7B, FIG. 7C, and FIG. 7D. FIG. 1B shows a circuit structure similar to that in FIG. 7B, FIG. 7C, and FIG. 7D where the light emitting units is first provided. The redistribution circuit layer RDL in FIG. 1B further includes a third circuit layer CL3 disposed under a second circuit layer CL2. Fourth pads 2481, 2482, and 2483 of the third circuit layer CL3 may be connected from a second side 202 to third pads 2131, 2132, and 2133 on a first side 201 through the redistribution circuit layer RDL. The fourth pads 2481, 2482, and 2483 are electrically connected to a pad PD1, a pad PD2, and a pad PD3 of a driving substrate SUB. In addition, first pads 2121, 2122, and 2123 may be reconfigured and/or integrated and connected to a second pad 242 to be electrically connected to a pad CP of the driving substrate SUB. With the above configuration, the driving substrate SUB may provide driving signals to a light emitting unit 300 through the pads PD1, PD2, and PD3, and provide common signals to the light emitting unit 300 through the pad CP. The circuit structure of the light emitting module may reduce the number of pads, reduce the risk of short circuit, increase the area of the pads, or reduce the difficulty in bonding with the driving substrate SUB, and the bonding quality of the light emitting module and the driving substrate SUB may be improved.

Figure 8A:
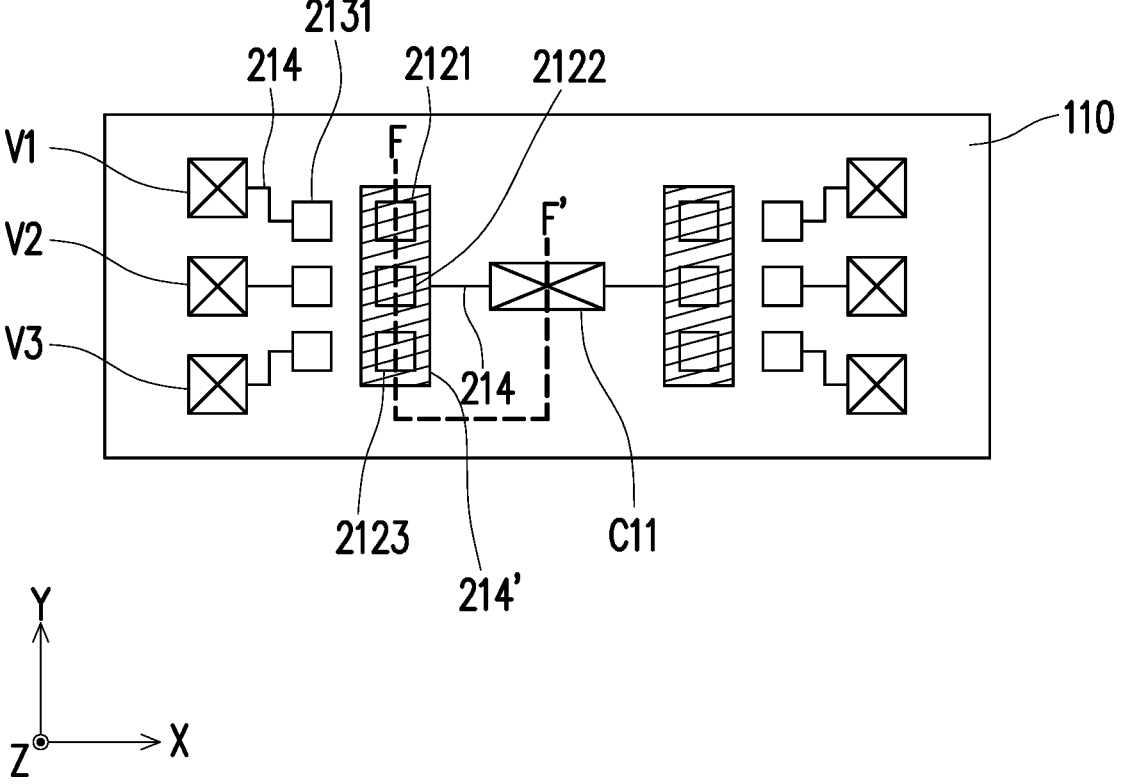
FIG. 8A is a schematic top view of a light emitting module according to another embodiment of the disclosure.
Figure 8B:
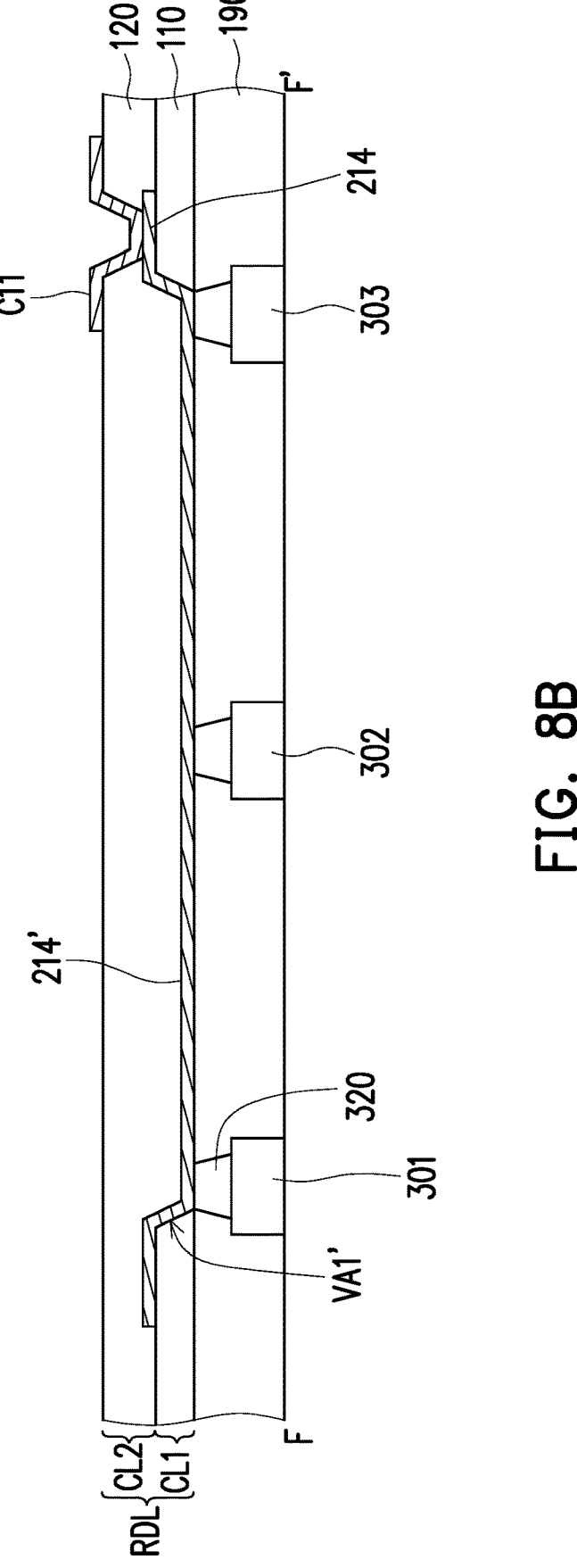
FIG. 8B is a cross-sectional view of the light emitting module of FIG. 7A along a section line F-F'.

FIG. 8A is a schematic top view of a light emitting module according to another embodiment of the disclosure. FIG. 8B is a cross-sectional view of the light emitting module of FIG. 8A along a section line F-F'. For clarity of the drawings and convenience of description, several elements are omitted in FIG. 8A and FIG. 8B. The circuit structure of this embodiment is generally similar to the circuit structure of FIG. 7A, so the same and similar components in the two embodiments are not repeated here. Compared to the embodiment of FIG. 7A, the main difference in the embodiment of FIG. 8A is that the second electrodes 320 of the first light emitting unit 301, the second light emitting unit 302, and the third light emitting unit 303 may be connected to the contact C11 through a conductive pattern 214'. For example, the dielectric layer 110 may be provided with an opening VA1'. The circuit 214 is disposed on the surface of the dielectric layer 110 and extends into the opening VA1'. The portion of the circuit 214 located in the opening VA1' may be defined as the conductive pattern 214'. Part of the conductive pattern 214' may be provided in the opening VA1' to be connected to the first light emitting unit 301, the second light emitting unit 302, and the third light emitting unit 303. The conductive pattern 214' is connected to the contact C11 through the circuit 214. With the configuration above, the ups and downs of the circuit on the surface of the dielectric layer which leads to an increase in impedance may be reduced. In addition, the circuit structure of this embodiment may achieve the same technical effects as the previous embodiments.

Figure 9A:
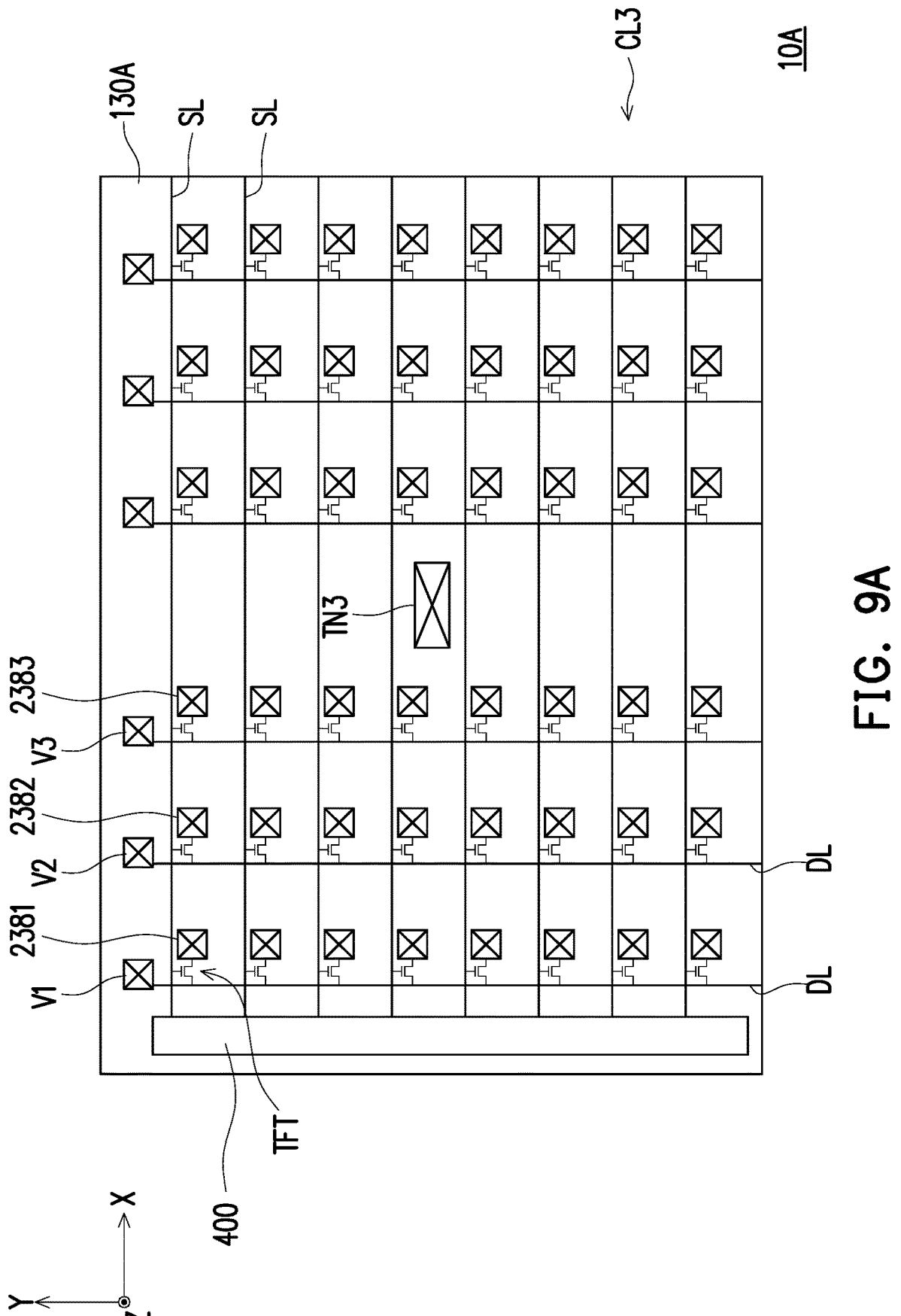
FIG. 9A is a schematic top view of one layer of a light emitting module according to another embodiment of the disclosure.

FIG. 9A is a schematic top view of one of a circuit layer of a light emitting module according to another embodiment of the disclosure. For clarity of the drawings and convenience of description, several elements are omitted in FIG. 9A. In FIG. 9A, a third circuit layer CL3 of a light emitting module 10A is, for example, an active array layer, including a dielectric layer 130A and a circuit layer.

For example, the circuit layer includes a plurality of scan lines SL and signal lines DL. The scan lines SL extend along the X-axis, and the signal lines DL extend along the Y-axis. The scan lines SL and the signal lines DL are arranged alternately. A plurality of thin film transistors TFT are arranged in an array and are electrically connected to the scan lines SL and the signal lines DL. The thin film transistor TFT includes, for example, a semiconductor channel layer, a gate, and a source, and a drain electrically connected to the semiconductor channel layer. The material of the semiconductor channel layer includes, for example, amorphous silicon, low temperature poly-silicon (LTPS), metal oxide, or a combination of the foregoing materials, and this disclosure is not limited thereto. In some embodiments, different thin film transistors TFT may have the different semiconductor materials as mentioned. Moreover, the thin film transistor TFT may include a top gate transistor, a bottom gate transistor, a dual gate transistor, and a double gate transistor as needed, but this disclosure is not limited thereto.

In this embodiment, the gate of the thin film transistor TFT may be electrically connected to one of the scan lines SL, and the source may be electrically connected to one of the signal lines DL. The materials of the gate, source, and drain may be the same as the pads or contacts described above, and the same detail is not repeated herein.

The dielectric layer 130A may be disposed on the circuit layer and are disposed with a plurality of contacts 2381, 2382, and 2383 in an array. Each of the contacts 2381, 2382, and 2383 are respectively arranged to correspond to the thin film transistor TFT. For example, the contact 2381 may be disposed correspondingly between the scan line SL and the signal line DL and be electrically connected to the drain of the thin film transistor TFT. In this way, the thin film transistor TFT may control the conduction of the contact 2381. The contacts 2381, 2382, and 2383 are respectively connected to the corresponding light emitting unit 300. As mentioned above, the contacts 2381, 2382, and 2383 may respectively include an upper pad, a lower pad on the dielectric layer 130, and a connection portion that penetrates the dielectric layer 130 and connects the upper pad to the lower pad. The thin film transistor TFT may be connected to the upper pads of the contacts 2381, 2382, and 2383. Consequently, the thin film transistor TFT is electrically connected to one of the light emitting units 300, and the thin film transistor TFT may be adapted as a switch for controlling the light emitting unit 300.

In some embodiments, the circuit layer further includes a driving circuit 400. The driving circuit 400 is, for example, a gate driving circuit. The driving circuit 400 is electrically connected to the scan lines SL to control the on and off of the gate of the thin film transistor TFT. The contacts 2381, 2382, and 2383 are electrically connected to the signal lines DL through the thin film transistor TFT. The signal lines DL are connected to the vias V1, V2, and V3. As mentioned above, the vias V1, V2, and V3 may respectively include an upper pad on the dielectric layer 130A, a lower pad, and a connection portion that penetrates the dielectric layer 130A and connects the upper pad to the lower pad. In addition, the transfer node TN3 may integrate the common voltage signal line of each of the light emitting units 300, and then penetrate the dielectric layer 130A to be connected to the lower surface of the dielectric layer 130A or other circuit layers.

Figure 9B:
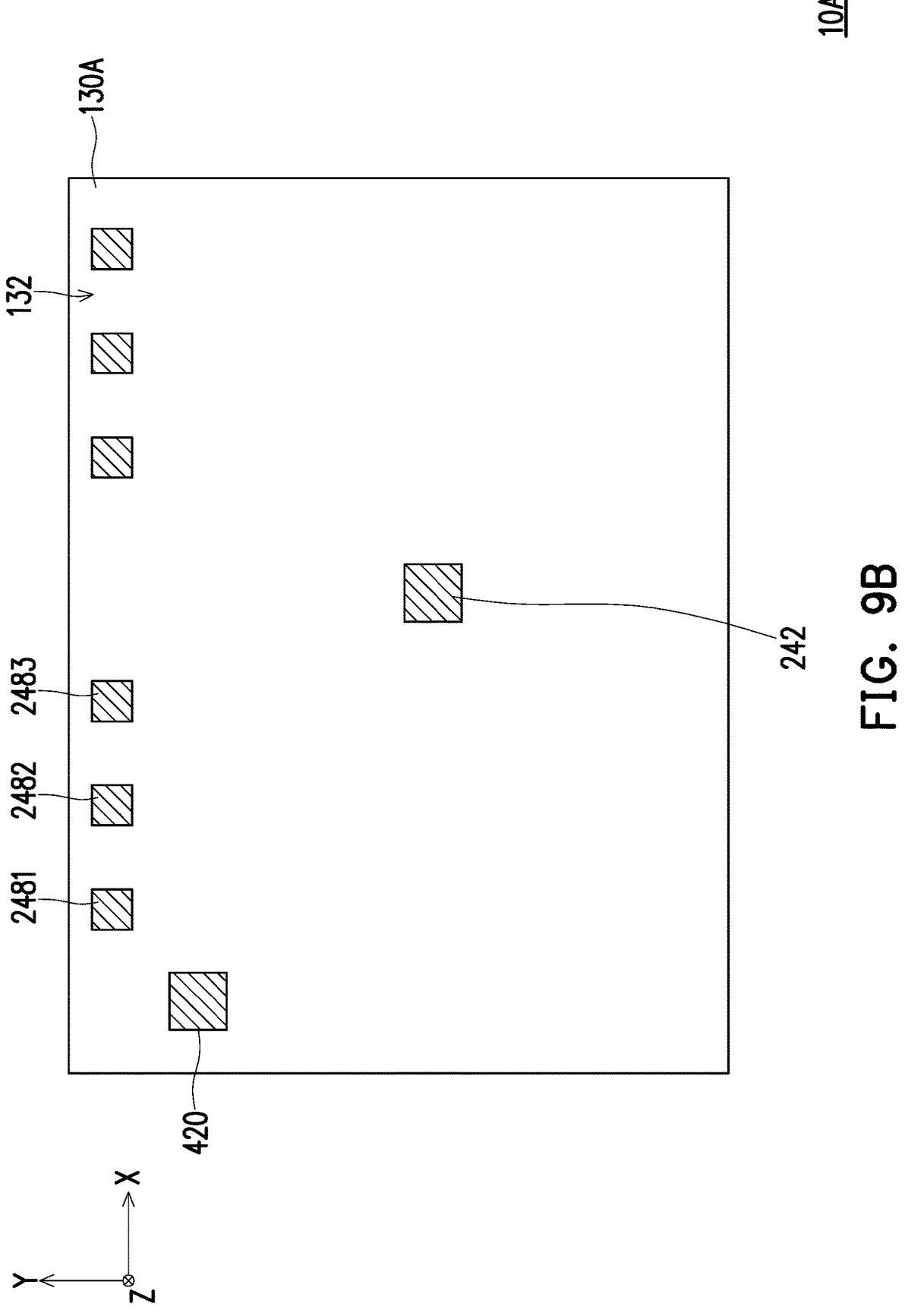
FIG. 9B is a schematic bottom view of a light emitting module according to another embodiment of the disclosure.

FIG. 9B is a schematic bottom view of a light emitting module according to another embodiment of the disclosure. For clarity of the drawings and convenience of description, several elements are omitted in FIG. 9B. In FIG. 9B, a plurality of pads are provided on a lower surface 132 (i.e., the second side) of a dielectric layer 130A of a third circuit layer CL3 of a light emitting module 10A. In FIG. 9A and FIG. 9B, lower pads of vias V1, V2, and V3 may be electrically connected to fourth pads 2481, 2482, and 2483. In another embodiment, the lower pads on the bottom surface of the vias V1, V2, and V3 may be adapted as the fourth pads 2481, 2482, and 2483. The driving circuit 400 is electrically connected to a pad 420 correspondingly. A bottom surface of a transfer node TN3 penetrating the dielectric layer 130A is electrically connected to the second pad 242 correspondingly. The transfer node TN3 and the corresponding second pad 242 may have different shapes in a Z direction, but it is not limited thereto. With the configuration above, the light emitting module 10A may further reduce the number of pads, reduce the risk of short circuit, increase the area of the pads, reduce the difficulty in bonding with the driving substrate SUB, or improve the bonding quality of the light emitting module 10A and the driving substrate SUB through the active array layer and the driving circuit 400.

Figure 10A:
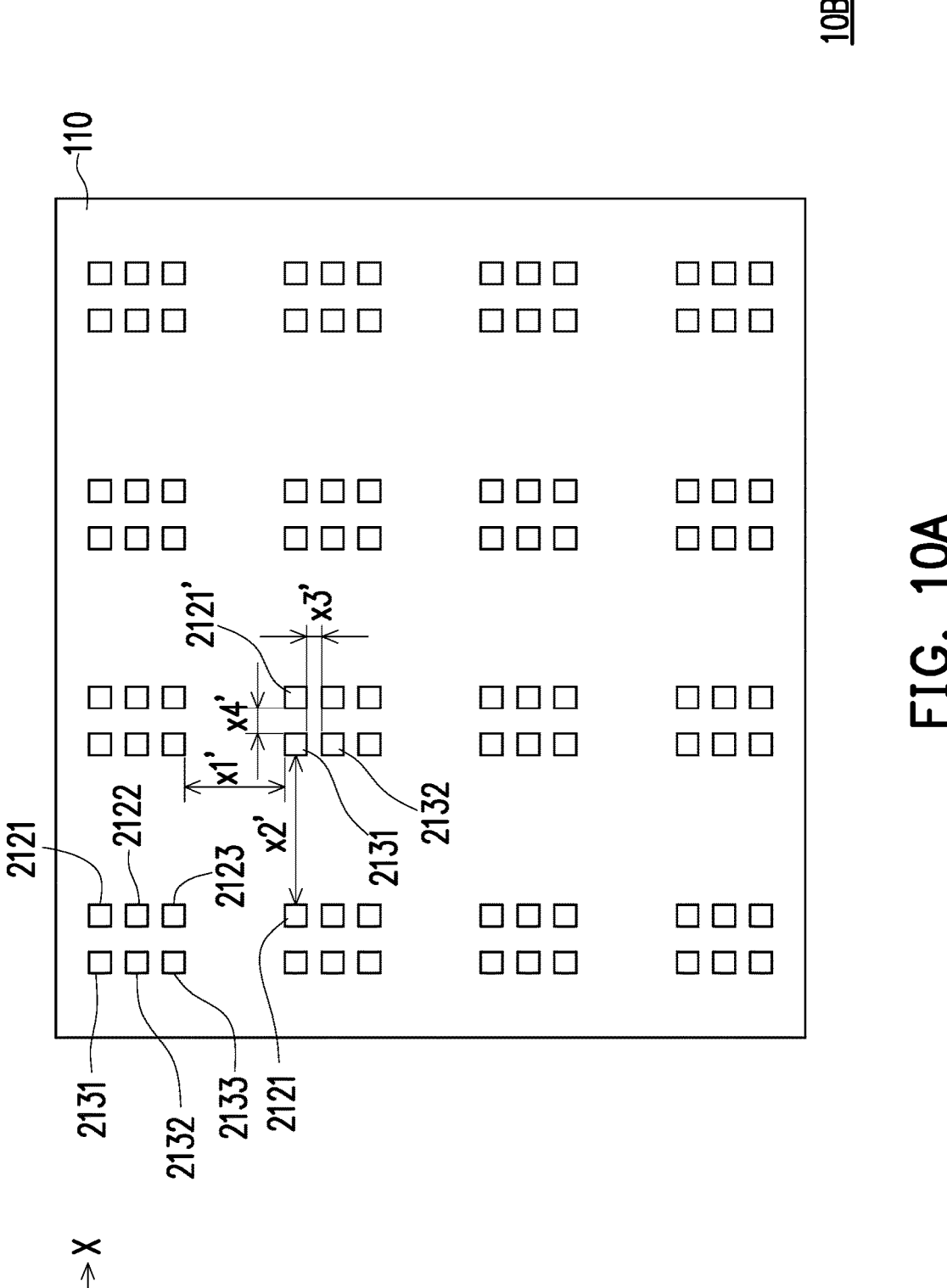
FIG. 10A is a schematic top view of a light emitting module according to yet another embodiment of the disclosure.
Figure 10B:
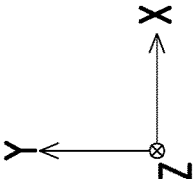
FIG. 10B is a schematic bottom view of a light emitting module according to yet another embodiment of the disclosure.

FIG. 10A is a schematic top view of a light emitting module according to yet another embodiment of the disclosure. FIG. 10B is a schematic bottom view of a light emitting module according to yet another embodiment of the disclosure. For clarity of the drawings and convenience of description, several elements are omitted in FIG. 10A and FIG. 10B. Please refer to FIG. 10A and FIG. 10B. Similar to FIG. 2A, FIG. 10A shows that a plurality of first pads 2121, 2122, and 2123 and a plurality of third pads 2131, 2132, and 2133 are arranged in pairs on an upper surface 111 of a dielectric layer 110 (that is, the first side of the circuit structure). FIG. 10B shows a plurality of fourth pads 2481', 2482', 2483' and a second pad 242' on a lower surface 132 of the dielectric layer 130 (i.e., the second side of the circuit structure). In this embodiment, the degree of dispersion of the fourth pads is greater than the degree of dispersion of the third pads. The degree of dispersion discussed above may be defined by the reciprocal of the standard deviation, as shown in the following equation:

$$SD = \sqrt{\frac{1}{N}\sum_{i=1}^{N}(xi-\mu)^2}. \qquad \text{(Equation 1)}$$

In the above equation, SD is the standard deviation, xi is the distance between adjacent pads, N is the number of the adjacent pads and is a positive integer, μ is the average distance between the adjacent pads (the sum of all adjacent pad distances divided by the number N). In this way, the reciprocal of the measured standard deviation SD may be used to define the degree of dispersion of the pads. When the standard deviation SD is larger, its reciprocal value is smaller, which means that the distance between adjacent pads is set to deviate from the average value, resulting in a poor degree of dispersion. When the standard deviation SD is smaller, its reciprocal value is larger, which means that the distance between adjacent pads is set toward the average value, resulting in a better degree of dispersion.

In the embodiment shown in FIG. 10A, a distance x1' is the distance between the third pad 2131 to the third pad 2133 in the Y direction. A distance x2' is the distance between the third pad 2131 and the first pad 2121 in the X direction. A distance x3' is the distance between the third pad 2131 to the third pad 2132 in the Y direction. And a distance x4' is the distance between the third pad 2131 and the first pad 2121' in the X direction.

In the embodiment shown in FIG. 10B, distances x1", x2", x3", and x4" are the distances from the fourth pad 2481' to four adjacent fourth pads in different directions.

As shown in FIG. 10A, the distances of the distance x1', the distance x2', the distance x3', and the distance x4' are different from each other, and the difference between each and the average value of distance x1", distance x2", distance x3", and distance x4" is relatively bigger. Relative to the distances between the pads shown in FIG. 10A, the distance x1", the distance x2", the distance x3", and the distance x4" shown in FIG. 10B are similar to each other, and the difference between each and the average value of distance x1", distance x2", distance x3", and distance x4" is relatively smaller. Based on the above, a standard deviation SD' of the distance between the third pad 2131 on the first side and its adjacent pads is greater than a standard deviation SD" of the distance between the fourth pad 2481' on the second side and its adjacent pads. In other words, the degree of dispersion of the fourth pads 2481' (i.e., the reciprocal of the standard deviation SD") is better than the degree of dispersion of the first pads 2121, 2122, and 2123 or that between the third pads 2131, 2132, and 2133 (i.e., the reciprocal of the standard deviation SD'), and thus the fourth pads 2481', 2482', and 2483' are arranged more evenly. Consequently, the circuit structure of the light emitting module 10B may reduce the number of pads, reduce the risk of short circuit, increase the area of the pads, or reduce the difficulty in bonding with the driving substrate SUB. In addition, the distances between the fourth pads 2481', 2482', and 2483' may be increased. And the bonding quality of the light emitting module 10B and the driving substrate SUB may be improved.

In summary, in the light emitting module and the light emitting device of the embodiments of the present disclosure, since the pads on the second side of the circuit structure may be reconfigured or integrated through the redistribution circuit layer, the number of the pads on the second side of the circuit structure may be reduced, the risk of short circuit may be reduced, or the difficulty in bonding with the driving substrate may be reduced. The bonding quality of the light emitting module and the driving substrate may be improved. And the light emitting device may have better bonding quality or display quality. Furthermore, since the degree of dispersion of a fourth pad on the second side of the circuit structure and its adjacent pads may be less than the degree of dispersion of a first pad or a third pad on the first side of the circuit structure and their adjacent pads, the distance between the pads on the second side may be evenly dispersed, reducing the risk of short circuit or the difficulty in bonding with the driving substrate. Moreover, the distance between the adjacent pads on the second side may also be increased. The bonding quality of the light emitting module and the driving substrate may be improved. And the light emitting device may have better bonding quality or display quality.

Lastly, the above embodiments are only used to illustrate the technical solutions of the disclosure without limiting the disclosure; although the disclosure has been described in detail with reference to the foregoing embodiments, those of ordinary skill in the art should understand that they may still recombine or modify the technical solutions described in each of the foregoing embodiments, or substitute some or all of the technical features with their equivalence; and the entities of those corresponding technical solutions with such combinations, modifications, or substitutions do not deviate from the scope of the technical solutions of the embodiments of the disclosure.

What is claimed is:

1. A light emitting module, comprising:

a circuit structure, comprising a first side and a second side opposite to the first side, and the circuit structure comprising:

a plurality of first pads, disposed on the first side;

at least one second pad, disposed on the second side, wherein the first pads are electrically connected to the at least one second pad;

a plurality of third pads, disposed on the first side;

a plurality of fourth pads, disposed on the second side, wherein the third pads are electrically connected to the corresponding fourth pads;

a redistribution circuit layer, disposed between the plurality of first pads and the at least one second pad, wherein the redistribution circuit layer comprises:

a first circuit layer, comprising a plurality of conductive vias, a first contact, and a first circuit, wherein each of the conductive vias and the first contact are electrically connected to the corresponding first pad through the first circuit;

a second circuit layer, comprising a plurality of first transfer nodes, a plurality of second contacts, and a plurality of second circuits, wherein each of the first transfer nodes is electrically connected to the corresponding first contact, and the plurality of first transfer nodes are electrically connected to the corresponding second contact through the corresponding second circuit;

a third circuit layer, comprising a plurality of second transfer nodes, a plurality of third contacts, a plurality of third circuits, a plurality of fourth contacts, and a plurality of fifth pads, wherein each of the second transfer nodes is electrically connected to the corresponding second contact, the plurality of second transfer nodes are electrically connected to the corresponding third contact through the corresponding third circuit, the plurality of fourth contacts are electrically connected to the plurality of fifth pads through the corresponding third circuit, and the plurality of fifth pads are electrically connected to the corresponding conductive vias; and a width of one of the plurality of first transfer nodes is greater than a width of one of the plurality of first pads, and the width of the one of the plurality of first transfer nodes is smaller than a width of one of the at least one second pad; and a plurality of light emitting units, electrically connected to the plurality of first pads, wherein a number of the plurality of first pads is greater than a number of the at least one second pad, wherein the plurality of fourth pads are electrical connected to the plurality of third pads through the corresponding fourth contacts and the corresponding conductive vias.

2. The light emitting module according to claim 1, wherein the plurality of first pads and the at least one second pad are configured to receive a common voltage.

3. The light emitting module according to claim 1, wherein an area of one of the at least one second pad is larger than an area of one of the plurality of first pads.

4. The light emitting module according to claim 1, wherein the plurality of first pads are electrically connected to the at least one second pad through the redistribution circuit layer.

5. The light emitting module according to claim 4, wherein a number of the plurality of first transfer nodes is greater than the number of the at least one second pad, and the number of the plurality of first transfer nodes is less than the number of the plurality of first pads.

6. The light emitting module according to claim 1, wherein a degree of dispersion of the plurality of fourth pads is greater than a degree of dispersion of the plurality of third pads.

7. The light emitting module according to claim 1, wherein the circuit structure further comprises a thin film transistor electrically connected to at least one of the plurality of light emitting units.

8. A light emitting device, comprising:

a driving substrate; and a plurality of the light emitting modules according to claim 1, wherein each of the light emitting modules is electrically connected to the driving substrate through the at least one second pad.

9. The light emitting module according to claim 1, wherein a number of the plurality of third pads is equal to a number of the plurality of fourth pads.

* * * * *